United States Patent [19]

Kumaki et al.

[11] Patent Number: 5,539,401
[45] Date of Patent: Jul. 23, 1996

[54] VARIABLE-LENGTH CODE TABLE AND VARIABLE-LENGTH CODING DEVICE

[75] Inventors: Satoshi Kumaki; Kazuya Ishihara; Shinichi Nakagawa; Atsuo Hanami, all of Hyogo, Japan

[73] Assignee: Mitsubishi Denki Kabushiki Kaisha, Tokyo, Japan

[21] Appl. No.: 483,035

[22] Filed: Jun. 7, 1995

[30] Foreign Application Priority Data

Aug. 31, 1994 [JP] Japan .................................. 6-206554

[51] Int. Cl.$^6$ .................................................. H03M 7/40
[52] U.S. Cl. .............................. 341/67; 341/63; 341/106
[58] Field of Search ............................. 341/65, 67, 106, 341/50, 63

[56] References Cited

U.S. PATENT DOCUMENTS

| | | | |
|---|---|---|---|
| 5,381,144 | 1/1995 | Wilson | 341/63 |
| 5,394,143 | 2/1995 | Murray | 341/63 |
| 5,398,027 | 3/1995 | Ooi | 341/67 |

FOREIGN PATENT DOCUMENTS

| | | |
|---|---|---|
| 4-142163 | 5/1992 | Japan . |
| 4-235470 | 8/1992 | Japan . |
| 5-56283 | 3/1993 | Japan . |

OTHER PUBLICATIONS

CCITT Recommendation H. 261, pp. 95–96.
An Entropy Coding System for Digital HDTV Applications, IEEE Trans. on Circuit and Systems for Video Tech. vol. 1, No. 1, Mar. 1991.

*Primary Examiner*—Jeffrey A. Gaffin
*Assistant Examiner*—JeanPierre Peguy
*Attorney, Agent, or Firm*—Lowe, Price, LeBlanc & Becker

[57] ABSTRACT

A variable-length code table, which is used for producing a variable-length code from data formed of one set of first and second equal-length components, stores at an address uniquely assigned by the one set of the equal-length components a corresponding variable-length code and a code length of the variable-length code. Combination of the first and second equal-length components is preselected such that the maximum value of the absolute value of the first equal-length component increases as the absolute value of the second equal-length component combined therewith decreases. The second equal-length components are classified into a plurality of classes in accordance with the magnitude of the absolute value. Each address includes a first region having a value and a length uniquely specified based on the class including the second equal-length component, a second region storing the first equal-length component, and a third region storing the second equal-length component, and is constructed to have a fixed length as a whole. Region lengths of the second and third regions are determined correspondingly to the class including the second equal-length component, and each are specifically determined to have the minimum value required for storing the maximum values of the absolute values of the first and second equal-length components of the combinations of the equal-length components included in the corresponding class.

12 Claims, 35 Drawing Sheets

FIG. 5    RELATED ART

| RUN | LEVEL | VARIABLE-LENGTH CODE |
|---|---|---|
| 0 | 0 | 10 |
| 0 | 1 | 110 |
| 0 | -1 | 111 |
| 1 | 1 | 0110 |
| 1 | -1 | 0111 |
| 0 | 2 | 01000 |
| 0 | -2 | 01001 |
| 2 | 1 | 01010 |
| 2 | -1 | 01011 |
| 0 | 3 | 001010 |
| 0 | -3 | 001011 |
| 3 | 1 | 001110 |
| 3 | -1 | 001111 |
| 4 | 1 | 001100 |
| 4 | -1 | 001101 |
| 1 | 2 | 0001100 |
| 1 | -2 | 0001101 |
| 5 | 1 | 0001110 |
| 5 | -1 | 0001111 |
| 6 | 1 | 0001010 |
| 6 | -1 | 0001011 |
| 7 | 1 | 0001000 |
| 7 | -1 | 0001001 |
| 0 | 4 | 00001100 |
| 0 | -4 | 00001101 |
| 2 | 2 | 00001000 |
| 2 | -2 | 00001001 |
| 8 | 1 | 00001110 |
| 8 | -1 | 00001111 |
| 9 | 1 | 00001010 |
| 9 | -1 | 00001011 |
| 0 | 6 | 001000010 |
| 0 | -6 | 001000011 |
| 0 | 5 | 001001100 |
| 0 | -5 | 001001101 |
| 1 | 3 | 001001010 |
| 1 | -3 | 001001011 |
| 3 | 2 | 001001000 |
| 3 | -2 | 001001001 |

FIG. 6    RELATED ART

| RUN | LEVEL | VARIABLE-LENGTH CODE |
|---|---|---|
| 10 | 1 | 001001110 |
| 10 | -1 | 001001111 |
| 11 | 1 | 001000110 |
| 11 | -1 | 001000111 |
| 12 | 1 | 001000100 |
| 12 | -1 | 001000101 |
| 13 | 1 | 001000000 |
| 13 | -1 | 001000001 |
| 0 | 7 | 00000010100 |
| 0 | -7 | 00000010101 |
| 1 | 4 | 00000011000 |
| 1 | -4 | 00000011001 |
| 2 | 3 | 00000010110 |
| 2 | -3 | 00000010111 |
| 4 | 2 | 00000011110 |
| 4 | -2 | 00000011111 |
| 5 | 2 | 00000010010 |
| 5 | -2 | 00000010011 |
| 14 | 1 | 00000011100 |
| 14 | -1 | 00000011101 |
| 15 | 1 | 00000011010 |
| 15 | -1 | 00000011011 |
| 16 | 1 | 00000010000 |
| 16 | -1 | 00000010001 |
| 0 | 11 | 0000000100000 |
| 0 | -11 | 0000000100001 |
| 0 | 10 | 0000000100110 |
| 0 | -10 | 0000000100111 |
| 0 | 9 | 0000000110000 |
| 0 | -9 | 0000000110001 |
| 0 | 8 | 0000000111010 |
| 0 | -8 | 0000000111011 |
| 1 | 5 | 0000000110110 |
| 1 | -5 | 0000000110111 |
| 2 | 4 | 0000000101000 |
| 2 | -4 | 0000000101001 |
| 3 | 3 | 0000000111000 |
| 3 | -3 | 0000000111001 |
| 4 | 3 | 0000000100100 |

FIG. 7  RELATED ART

| RUN | LEVEL | VARIABLE-LENGTH CODE |
|---|---|---|
| 4 | -3 | 0000000100101 |
| 6 | 2 | 0000000111100 |
| 6 | -2 | 0000000111101 |
| 7 | 2 | 0000000101010 |
| 7 | -2 | 0000000101011 |
| 8 | 2 | 0000000100010 |
| 8 | -2 | 0000000100011 |
| 17 | 1 | 0000000111110 |
| 17 | -1 | 0000000111111 |
| 18 | 1 | 0000000110100 |
| 18 | -1 | 0000000110101 |
| 19 | 1 | 0000000110010 |
| 19 | -1 | 0000000110011 |
| 20 | 1 | 0000000101110 |
| 20 | -1 | 0000000101111 |
| 21 | 1 | 0000000101100 |
| 21 | -1 | 0000000101101 |
| 0 | 15 | 00000000101110 |
| 0 | -15 | 00000000101111 |
| 0 | 14 | 00000000110000 |
| 0 | -14 | 00000000110001 |
| 0 | 13 | 00000000110010 |
| 0 | -13 | 00000000110011 |
| 0 | 12 | 00000000110100 |
| 0 | -12 | 00000000110101 |
| 1 | 7 | 00000000101010 |
| 1 | -7 | 00000000101011 |
| 1 | 6 | 00000000101100 |
| 1 | -6 | 00000000101101 |
| 2 | 5 | 00000000101000 |
| 2 | -5 | 00000000101001 |
| 3 | 4 | 00000000100110 |
| 3 | -4 | 00000000100111 |
| 5 | 3 | 00000000100100 |
| 5 | -3 | 00000000100101 |
| 9 | 2 | 00000000100010 |
| 9 | -2 | 00000000100011 |
| 10 | 2 | 00000000100000 |
| 10 | -2 | 00000000100001 |

FIG. 8  RELATED ART

| RUN | LEVEL | VARIABLE-LENGTH CODE |
|---|---|---|
| 22 | 1 | 00000000111110 |
| 22 | -1 | 00000000111111 |
| 23 | 1 | 00000000111100 |
| 23 | -1 | 00000000111101 |
| 24 | 1 | 00000000111010 |
| 24 | -1 | 00000000111011 |
| 25 | 1 | 00000000111000 |
| 25 | -1 | 00000000111001 |
| 26 | 1 | 00000000110110 |
| 26 | -1 | 00000000110111 |
| 0 | 31 | 000000000100000 |
| 0 | -31 | 000000000100001 |
| 0 | 30 | 000000000100010 |
| 0 | -30 | 000000000100011 |
| 0 | 29 | 000000000100100 |
| 0 | -29 | 000000000100101 |
| 0 | 28 | 000000000100110 |
| 0 | -28 | 000000000100111 |
| 0 | 27 | 000000000101000 |
| 0 | -27 | 000000000101001 |
| 0 | 26 | 000000000101010 |
| 0 | -26 | 000000000101011 |
| 0 | 25 | 000000000101100 |
| 0 | -25 | 000000000101101 |
| 0 | 24 | 000000000101110 |
| 0 | -24 | 000000000101111 |
| 0 | 23 | 000000000110000 |
| 0 | -23 | 000000000110001 |
| 0 | 22 | 000000000110010 |
| 0 | -22 | 000000000110011 |
| 0 | 21 | 000000000110100 |
| 0 | -21 | 000000000110101 |
| 0 | 20 | 000000000110110 |
| 0 | -20 | 000000000110111 |
| 0 | 19 | 000000000111000 |
| 0 | -19 | 000000000111001 |
| 0 | 18 | 000000000111010 |
| 0 | -18 | 000000000111011 |
| 0 | 17 | 000000000111100 |

FIG. 9   RELATED ART

| RUN | LEVEL | VARIABLE-LENGTH CODE |
|---|---|---|
| 0 | -17 | 000000000111101 |
| 0 | 16 | 000000000111110 |
| 0 | -16 | 000000000111111 |
| 0 | 40 | 0000000000100000 |
| 0 | -40 | 0000000000100001 |
| 0 | 39 | 0000000000100010 |
| 0 | -39 | 0000000000100011 |
| 0 | 38 | 0000000000100100 |
| 0 | -38 | 0000000000100101 |
| 0 | 37 | 0000000000100110 |
| 0 | -37 | 0000000000100111 |
| 0 | 36 | 0000000000101000 |
| 0 | -36 | 0000000000101001 |
| 0 | 35 | 0000000000101010 |
| 0 | -35 | 0000000000101011 |
| 0 | 34 | 0000000000101100 |
| 0 | -34 | 0000000000101101 |
| 0 | 33 | 0000000000101110 |
| 0 | -33 | 0000000000101111 |
| 0 | 32 | 0000000000110000 |
| 0 | -32 | 0000000000110001 |
| 1 | 14 | 0000000000110010 |
| 1 | -14 | 0000000000110011 |
| 1 | 13 | 0000000000110100 |
| 1 | -13 | 0000000000110101 |
| 1 | 12 | 0000000000110110 |
| 1 | -12 | 0000000000110111 |
| 1 | 11 | 0000000000111000 |
| 1 | -11 | 0000000000111001 |
| 1 | 10 | 0000000000111010 |
| 1 | -10 | 0000000000111011 |
| 1 | 9 | 0000000000111100 |
| 1 | -9 | 0000000000111101 |
| 1 | 8 | 0000000000111110 |
| 1 | -8 | 0000000000111111 |
| 1 | 18 | 0000000000100000 |
| 1 | -18 | 0000000000100001 |
| 1 | 17 | 0000000000100010 |
| 1 | -17 | 0000000000100011 |

FIG. 10    RELATED ART

| RUN | LEVEL | VARIABLE-LENGTH CODE |
|---|---|---|
| 1 | -16 | 0000000000100101 |
| 1 | 15 | 0000000000100110 |
| 1 | -15 | 0000000000100111 |
| 6 | 3 | 0000000000101000 |
| 6 | -3 | 0000000000101001 |
| 11 | 2 | 0000000000110100 |
| 11 | -2 | 0000000000110101 |
| 12 | 2 | 0000000000110010 |
| 12 | -2 | 0000000000110011 |
| 13 | 2 | 0000000000110000 |
| 13 | -2 | 0000000000110001 |
| 14 | 2 | 0000000000101110 |
| 14 | -2 | 0000000000101111 |
| 15 | 2 | 0000000000101100 |
| 15 | -2 | 0000000000101101 |
| 16 | 2 | 0000000000101010 |
| 16 | -2 | 0000000000101011 |
| 27 | 1 | 0000000000111110 |
| 27 | -1 | 0000000000111111 |
| 28 | 1 | 0000000000111100 |
| 28 | -1 | 0000000000111101 |
| 29 | 1 | 0000000000111010 |
| 29 | -1 | 0000000000111011 |
| 30 | 1 | 0000000000111000 |
| 30 | -1 | 0000000000111001 |
| 31 | 1 | 0000000000110110 |
| 31 | -1 | 0000000000110111 |

FIG. 13

| LEVEL RANGE | | | | | | | |
|---|---|---|---|---|---|---|---|
| −1〜+1 | | −2, 2 | | −6〜−3,+3〜+6 | | OTHERS | |
| RUN | LEVEL | RUN | LEVEL | RUN | LEVEL | RUN | LEVEL |
| 0 | 0 | 0〜16 | 2 | 0〜6 | 3 | 0 | 7〜18 |
| 0〜31 | 1 | | | 0〜3 | 4 | 1 | 7〜18 |
| | | | | 0〜2 | 5 | 0 | 19〜40 |
| | | | | 0,1 | 6 | | |
| 6 | 2 | 5 | 3 | 3 | 4 | 2 | 7 |
| REQUIRED BIT NUMBER | | | | | | | |

FIG. 14

| LEVEL RANGE | ADDRESS 50 | | |
|---|---|---|---|
| −1〜+1 | 0 0 | RUN: 6 BITS | LEVEL: 2 BITS |
| −2, +2 | 0 1 | RUN: 5 BITS | LEVEL: 3 BITS |
| −6〜−3, +3〜+6 | 1 0 | RUN: 3 BITS | LEVEL: 4 BITS |
| OTHERS | 1 1 | RUN: 2 BITS | LEVEL: 7 BITS |

FIG. 15

| RUN | ABSOLUTE VALUE OF LEVEL | CODE |
|---|---|---|
| 0 | 1 | 11s |
| 0 | 2 | 0100 s |
| 0 | 3 | 0010 1s |
| 0 | 4 | 0000 110s |
| 0 | 5 | 0010 0110 s |
| 0 | 6 | 0010 0001 s |
| 0 | 7 | 0000 0010 10s |
| 0 | 8 | 0000 0001 1101 s |
| 0 | 9 | 0000 0001 1000 s |
| 0 | 10 | 0000 0001 0011 s |
| 0 | 11 | 0000 0001 0000 s |
| 0 | 12 | 0000 0000 1101 0s |
| 0 | 13 | 0000 0000 1100 1s |
| 0 | 14 | 0000 0000 1100 0s |
| 0 | 15 | 0000 0000 1011 1s |
| 1 | 1 | 011s |
| 1 | 2 | 0001 10s |
| 1 | 3 | 0010 0101 s |
| 1 | 4 | 0000 0011 00s |
| 1 | 5 | 0000 0001 1011 s |
| 1 | 6 | 0000 0000 1011 0s |
| 1 | 7 | 0000 0000 1010 1s |
| 2 | 1 | 0101 s |
| 2 | 2 | 0000 100s |
| 2 | 3 | 0000 0010 11s |
| 2 | 4 | 0000 0001 0100 s |
| 2 | 5 | 0000 0000 1010 0s |
| 3 | 1 | 0011 1s |
| 3 | 2 | 0010 0100 s |
| 3 | 3 | 0000 0001 1100 s |
| 3 | 4 | 0000 0000 1001 1s |

FIG. 16

| RUN | ABSOLUTE VALUE OF LEVEL | CODE |
|---|---|---|
| 4 | 1 | 0011 0s |
| 4 | 2 | 0000 0011 11s |
| 4 | 3 | 0000 0001 0010 s |
| 5 | 1 | 0001 11s |
| 5 | 2 | 0000 0010 01s |
| 5 | 3 | 0000 0000 1001 0s |
| 6 | 1 | 0001 01s |
| 6 | 2 | 0000 0001 1110 s |
| 7 | 1 | 0001 00s |
| 7 | 2 | 0000 0001 0101 s |
| 8 | 1 | 0000 111s |
| 8 | 2 | 0000 0001 0001 s |
| 9 | 1 | 0000 101s |
| 9 | 2 | 0000 0000 1000 1s |
| 10 | 1 | 0010 0111 s |
| 10 | 2 | 0000 0000 1000 0s |
| 11 | 1 | 0010 0011 s |
| 12 | 1 | 0010 0010 s |
| 13 | 1 | 0010 0000 s |
| 14 | 1 | 0000 0011 10s |
| 15 | 1 | 0000 0011 01s |
| 16 | 1 | 0000 0010 00s |
| 17 | 1 | 0000 0001 1111 s |
| 18 | 1 | 0000 0001 1010 s |
| 19 | 1 | 0000 0001 1001 s |
| 20 | 1 | 0000 0001 0111 s |
| 21 | 1 | 0000 0001 0110 s |
| 22 | 1 | 0000 0000 1111 1s |
| 23 | 1 | 0000 0000 1111 0s |
| 24 | 1 | 0000 0000 1110 1s |
| 25 | 1 | 0000 0000 1110 0s |
| 26 | 1 | 0000 0000 1101 1s |

FIG. 18

| LEVEL RANGE | | | | | |
|---|---|---|---|---|---|
| 0, 1 | | 2 - 7 | | 8 OR MORE | |
| RUN | LEVEL | RUN | LEVEL | RUN | LEVEL |
| 0 | 0 - 15 | 2 | 1 - 5 | 8 - 10 | 1, 2 |
| 1 | 1 - 7 | 3 | 1 - 4 | 11 - 26 | 1 |
| | | 4 | 1 - 3 | | |
| | | 5 | 1 - 3 | | |
| | | 6 | 1, 2 | | |
| | | 7 | 1, 2 | | |
| 1 | 6 | 3 | 4 | 5 | 3 |
| REQUIRED BIT NUMBER | | | | | |

FIG. 19

| LEVEL RANGE | 52 — 1 BIT — ADDRESS |
|---|---|
| 0, 1 | 0  0 | RUN | LEVEL: 5 BIT |
| 2 - 7 | 0  1 | RUN: 3 BIT | LEVEL: 4 BIT |
| OTHERS | 1 | RUN: 5 BIT | LEVEL: 3 BIT |

FIG. 21

| | | LEVEL RANGE -1...+1(1) | | | | |
|---|---|---|---|---|---|---|
| | | ADDRESS BIT | | DATA BIT | | |
| | | 7-2 | 1-0 | 13-10 | 9-3 | 2-0 |
| RUN | LEVEL | RUN | LEVEL | NUMBER OF CONTINUING 0'S | REMAINING CODE | CODE LENGTH |
| 0 | 0 | 000000 | 00 | 0000 | 10 | 010 |
| 0 | 1 | 000000 | 01 | 0000 | 110 | 011 |
| 1 | 1 | 000001 | 01 | 0001 | 110 | 011 |
| 2 | 1 | 000010 | 01 | 0001 | 1010 | 100 |
| 3 | 1 | 000011 | 01 | 0010 | 1110 | 100 |
| 4 | 1 | 000100 | 01 | 0010 | 1100 | 100 |
| 5 | 1 | 000101 | 01 | 0011 | 1110 | 100 |
| 6 | 1 | 000110 | 01 | 0011 | 1010 | 100 |
| 7 | 1 | 000111 | 01 | 0001 | 1000 | 100 |
| 8 | 1 | 001000 | 01 | 0100 | 1110 | 100 |
| 9 | 1 | 001001 | 01 | 0100 | 1010 | 100 |
| 10 | 1 | 001010 | 01 | 0010 | 1001110 | 111 |
| 11 | 1 | 001011 | 01 | 0010 | 1000110 | 111 |
| 12 | 1 | 001100 | 01 | 0010 | 1000100 | 111 |
| 13 | 1 | 001101 | 01 | 0010 | 1000000 | 111 |
| 14 | 1 | 001110 | 01 | 0110 | 11100 | 101 |
| 15 | 1 | 001111 | 01 | 0110 | 11010 | 101 |
| 16 | 1 | 010000 | 01 | 0110 | 10000 | 101 |
| 17 | 1 | 010001 | 01 | 0111 | 111110 | 110 |
| 18 | 1 | 010010 | 01 | 0111 | 110100 | 110 |
| 19 | 1 | 010011 | 01 | 0111 | 110010 | 110 |
| 20 | 1 | 010100 | 01 | 0111 | 101110 | 110 |
| 21 | 1 | 010101 | 01 | 0111 | 101100 | 110 |
| 22 | 1 | 010110 | 01 | 1000 | 111110 | 110 |
| 23 | 1 | 010111 | 01 | 1000 | 111100 | 110 |
| 24 | 1 | 011000 | 01 | 1000 | 111010 | 110 |
| 25 | 1 | 011001 | 01 | 1000 | 111000 | 110 |
| 26 | 1 | 011010 | 01 | 1000 | 110110 | 110 |
| 27 | 1 | 011011 | 01 | 1011 | 111110 | 110 |
| 28 | 1 | 011100 | 01 | 1011 | 111100 | 110 |
| 29 | 1 | 011101 | 01 | 1011 | 111010 | 110 |
| 30 | 1 | 011110 | 01 | 1011 | 111000 | 110 |
| 31 | 1 | 011111 | 01 | 1011 | 110110 | 110 |

FIG. 22

| | | LEVEL RANGE -1...+1(2) | | | | |
|---|---|---|---|---|---|---|
| | | ADDRESS BIT | | DATA BIT | | |
| | | 7-2 | 1-0 | 13-10 | 9-3 | 2-0 |
| RUN | LEVEL | RUN | LEVEL | NUMBER OF CONTINUING 0'S | REMAINING CODE | CODE LENGTH |
| 0 | -1 | 000000 | 11 | 0000 | 111 | 011 |
| 1 | -1 | 000001 | 11 | 0001 | 111 | 011 |
| 2 | -1 | 000010 | 11 | 0001 | 1011 | 100 |
| 3 | -1 | 000011 | 11 | 0010 | 1111 | 100 |
| 4 | -1 | 000100 | 11 | 0010 | 1101 | 100 |
| 5 | -1 | 000101 | 11 | 0011 | 1111 | 100 |
| 6 | -1 | 000110 | 11 | 0011 | 1011 | 100 |
| 7 | -1 | 000111 | 11 | 0011 | 1001 | 100 |
| 8 | -1 | 001000 | 11 | 0100 | 1111 | 100 |
| 9 | -1 | 001001 | 11 | 0100 | 1011 | 100 |
| 10 | -1 | 001010 | 11 | 0010 | 1001111 | 111 |
| 11 | -1 | 001011 | 11 | 0010 | 1000111 | 111 |
| 12 | -1 | 001100 | 11 | 0010 | 1000101 | 111 |
| 13 | -1 | 001101 | 11 | 0010 | 1000001 | 111 |
| 14 | -1 | 001110 | 11 | 0110 | 11101 | 101 |
| 15 | -1 | 001111 | 11 | 0110 | 11011 | 101 |
| 16 | -1 | 010000 | 11 | 0110 | 10001 | 101 |
| 17 | -1 | 010001 | 11 | 0111 | 111111 | 110 |
| 18 | -1 | 010010 | 11 | 0111 | 110101 | 110 |
| 19 | -1 | 010011 | 11 | 0111 | 110011 | 110 |
| 20 | -1 | 010100 | 11 | 0111 | 101111 | 110 |
| 21 | -1 | 010101 | 11 | 0111 | 101101 | 110 |
| 22 | -1 | 010110 | 11 | 1000 | 111111 | 110 |
| 23 | -1 | 010111 | 11 | 1000 | 111101 | 110 |
| 24 | -1 | 011000 | 11 | 1000 | 111011 | 110 |
| 25 | -1 | 011001 | 11 | 1000 | 111001 | 110 |
| 26 | -1 | 011010 | 11 | 1000 | 110111 | 110 |
| 27 | -1 | 011011 | 11 | 1011 | 111111 | 110 |
| 28 | -1 | 011100 | 11 | 1011 | 111101 | 110 |
| 29 | -1 | 011101 | 11 | 1011 | 111011 | 110 |
| 30 | -1 | 011110 | 11 | 1011 | 111001 | 110 |
| 31 | -1 | 011111 | 11 | 1011 | 110111 | 110 |

FIG. 23

| | | LEVEL RANGE -2, +2 | | | | |
|---|---|---|---|---|---|---|
| | | ADDRESS BIT | | DATA BIT | | |
| | | 7-3 | 2-0 | 13-10 | 9-3 | 2-0 |
| RUN | LEVEL | RUN | LEVEL | NUMBER OF CONTINUING 0'S | REMAINING CODE | CODE LENGTH |
| 0 | 2 | 00000 | 000 | 0001 | 1000 | 100 |
| 1 | 2 | 00001 | 010 | 0011 | 1100 | 100 |
| 2 | 2 | 00010 | 010 | 0100 | 1000 | 100 |
| 3 | 2 | 00011 | 010 | 0010 | 1001000 | 111 |
| 4 | 2 | 00100 | 010 | 0110 | 11110 | 101 |
| 5 | 2 | 00101 | 010 | 0110 | 10010 | 101 |
| 6 | 2 | 00110 | 010 | 0111 | 111100 | 110 |
| 7 | 2 | 00111 | 010 | 0111 | 101010 | 110 |
| 8 | 2 | 01000 | 010 | 0111 | 100010 | 110 |
| 9 | 2 | 01001 | 010 | 1000 | 100010 | 110 |
| 10 | 2 | 01010 | 010 | 1000 | 100000 | 110 |
| 11 | 2 | 01011 | 010 | 1011 | 110100 | 110 |
| 12 | 2 | 01100 | 010 | 1011 | 110010 | 110 |
| 13 | 2 | 01101 | 010 | 1011 | 110000 | 110 |
| 14 | 2 | 01110 | 010 | 1011 | 101110 | 110 |
| 15 | 2 | 01111 | 010 | 1011 | 101100 | 110 |
| 16 | 2 | 10000 | 010 | 1011 | 101010 | 110 |
| 0 | -2 | 00000 | 110 | 0001 | 1001 | 100 |
| 1 | -2 | 00001 | 110 | 0011 | 1101 | 100 |
| 2 | -2 | 00010 | 110 | 0100 | 1001 | 100 |
| 3 | -2 | 00011 | 110 | 0010 | 1001001 | 111 |
| 4 | -2 | 00100 | 110 | 0110 | 11111 | 101 |
| 5 | -2 | 00101 | 110 | 0110 | 10011 | 101 |
| 6 | -2 | 00110 | 110 | 0111 | 111101 | 110 |
| 7 | -2 | 00111 | 110 | 0111 | 101011 | 110 |
| 8 | -2 | 01000 | 110 | 0111 | 100011 | 110 |
| 9 | -2 | 01001 | 110 | 1000 | 100011 | 110 |
| 10 | -2 | 01010 | 110 | 1000 | 100001 | 110 |
| 11 | -2 | 01011 | 110 | 1011 | 110101 | 110 |
| 12 | -2 | 01100 | 110 | 1011 | 110011 | 110 |
| 13 | -2 | 01101 | 110 | 1011 | 110001 | 110 |
| 14 | -2 | 01110 | 110 | 1011 | 101111 | 110 |
| 15 | -2 | 01111 | 110 | 1011 | 101101 | 110 |
| 16 | -2 | 10000 | 110 | 1011 | 101011 | 110 |

FIG. 24

| LEVEL RANGE -6...-3, +3...+6 | | | | | |
|---|---|---|---|---|---|
| | | ADDRESS BIT | | VARIABLE-LENGTH CODE | DATA BIT |
| | | 7-4 | 3-0 | 13-10 | 9-3 | 2-0 |
| RUN | LEVEL | RUN | LEVEL | NUMBER OF CONTINUING 0'S | REMAINING CODE | CODE LENGTH |
| 0 | 3 | 0000 | 0011 | 0010 | 1010 | 100 |
| 1 | 3 | 0001 | 0011 | 0010 | 1001010 | 111 |
| 2 | 3 | 0010 | 0011 | 0110 | 10110 | 101 |
| 3 | 3 | 0011 | 0011 | 0111 | 111000 | 110 |
| 4 | 3 | 0100 | 0011 | 0111 | 100100 | 110 |
| 5 | 3 | 0101 | 0011 | 1000 | 100100 | 110 |
| 6 | 3 | 0110 | 0011 | 1011 | 101000 | 110 |
| 0 | 4 | 0000 | 0100 | 0100 | 1100 | 100 |
| 1 | 4 | 0001 | 0100 | 0110 | 11000 | 101 |
| 2 | 4 | 0010 | 0100 | 0111 | 101000 | 110 |
| 3 | 4 | 0011 | 0100 | 1000 | 100110 | 110 |
| 0 | 5 | 0000 | 0101 | 0010 | 1001100 | 111 |
| 1 | 5 | 0001 | 0101 | 0111 | 110110 | 110 |
| 2 | 5 | 0010 | 0101 | 1000 | 101000 | 110 |
| 0 | 6 | 0000 | 0110 | 0010 | 1000010 | 111 |
| 1 | 6 | 0001 | 0110 | 1000 | 101100 | 110 |
| 0 | -3 | 0000 | 1101 | 0010 | 1011 | 100 |
| 1 | -3 | 0001 | 1101 | 0010 | 1001011 | 111 |
| 2 | -3 | 0010 | 1101 | 0110 | 10111 | 101 |
| 3 | -3 | 0011 | 1101 | 0111 | 111001 | 110 |
| 4 | -3 | 0100 | 1101 | 0111 | 100101 | 110 |
| 5 | -3 | 0101 | 1101 | 1000 | 100101 | 110 |
| 6 | -3 | 0110 | 1101 | 1011 | 101001 | 110 |
| 0 | -4 | 0000 | 1100 | 0100 | 1101 | 100 |
| 1 | -4 | 0001 | 1100 | 0110 | 11001 | 101 |
| 2 | -4 | 0010 | 1100 | 0111 | 101001 | 110 |
| 3 | -4 | 0011 | 1100 | 1000 | 100111 | 110 |
| 0 | -5 | 0000 | 1011 | 0010 | 1001101 | 111 |
| 1 | -5 | 0001 | 1011 | 0111 | 110111 | 110 |
| 2 | -5 | 0010 | 1011 | 1000 | 101001 | 110 |
| 0 | -6 | 0000 | 1010 | 0010 | 1000011 | 111 |
| 1 | -6 | 0001 | 1010 | 1000 | 101101 | 110 |

FIG. 25

| OTHER LEVEL RANGE (1) | | | | | | |
|---|---|---|---|---|---|---|
| \multicolumn{2}{c}{ADDRESS BIT} | | | VARIABLE-LENGTH CODE DATA BIT | | |
| 8-7 | 6-0 | | | 13-10 | 9-3 | 2-0 |
| RUN | LEVEL | RUN | LEVEL | NUMBER OF CONTINUING 0'S | REMAINING CODE | CODE LENGTH |
| 0 | 7 | 00 | 0000111 | 0110 | 10100 | 101 |
| 1 | 7 | 01 | 0000111 | 1000 | 101010 | 110 |
| 0 | 8 | 00 | 0001000 | 0111 | 111010 | 110 |
| 1 | 8 | 01 | 0001000 | 1010 | 111110 | 110 |
| 0 | 9 | 00 | 0001001 | 0111 | 110000 | 110 |
| 1 | 9 | 01 | 0001001 | 1010 | 111100 | 110 |
| 0 | 10 | 00 | 0001010 | 0111 | 100110 | 110 |
| 1 | 10 | 01 | 0001010 | 1010 | 111010 | 110 |
| 0 | 11 | 00 | 0001011 | 0111 | 100000 | 110 |
| 1 | 11 | 01 | 0001011 | 1010 | 111000 | 110 |
| 0 | 12 | 00 | 0001100 | 1000 | 110100 | 110 |
| 1 | 12 | 01 | 0001100 | 1010 | 110110 | 110 |
| 0 | 13 | 00 | 0001101 | 1000 | 110010 | 110 |
| 1 | 13 | 01 | 0001101 | 1010 | 110100 | 110 |
| 0 | 14 | 00 | 0001110 | 1000 | 110000 | 110 |
| 1 | 14 | 01 | 0001110 | 1010 | 110010 | 110 |
| 0 | 15 | 00 | 0001111 | 1000 | 101110 | 110 |
| 1 | 15 | 01 | 0001111 | 1011 | 100110 | 110 |
| 0 | 16 | 00 | 0010000 | 1001 | 111110 | 110 |
| 1 | 16 | 01 | 0010000 | 1011 | 100100 | 110 |
| 0 | 17 | 00 | 0010001 | 1001 | 111100 | 110 |
| 1 | 17 | 01 | 0010001 | 1011 | 100010 | 110 |
| 0 | 18 | 00 | 0010010 | 1001 | 111010 | 110 |
| 1 | 18 | 01 | 0010010 | 1011 | 100000 | 110 |
| 0 | 19 | 00 | 0010011 | 1001 | 111000 | 110 |
| 0 | 20 | 00 | 0010100 | 1001 | 110110 | 110 |
| 0 | 21 | 00 | 0010101 | 1001 | 110100 | 110 |
| 0 | 22 | 00 | 0010110 | 1001 | 110010 | 110 |
| 0 | 23 | 00 | 0010111 | 1001 | 110000 | 110 |
| 0 | 24 | 00 | 0011000 | 1001 | 101110 | 110 |
| 0 | 25 | 00 | 0011001 | 1001 | 101100 | 110 |
| 0 | 26 | 00 | 0011010 | 1001 | 101010 | 110 |
| 0 | 27 | 00 | 0011011 | 1001 | 101000 | 110 |
| 0 | 28 | 00 | 0011100 | 1001 | 100110 | 110 |
| 0 | 29 | 00 | 0011101 | 1001 | 100100 | 110 |
| 0 | 30 | 00 | 0011110 | 1001 | 100010 | 110 |

FIG. 26

| OTHER LEVEL RANGE (2) | | | | | | |
|---|---|---|---|---|---|---|
| | | ADDRESS BIT | | VARIABLE-LENGTH CODE DATA BIT | | |
| | | 7-3 | 2-0 | 13-10 | 9-3 | 2-0 |
| RUN | LEVEL | RUN | LEVEL | NUMBER OF CONTINUING 0'S | REMAINING CODE | CODE LENGTH |
| 0 | 31 | 00 | 0011111 | 1001 | 100000 | 110 |
| 0 | 32 | 00 | 0100000 | 1010 | 110000 | 110 |
| 0 | 33 | 00 | 0100001 | 1010 | 101110 | 110 |
| 0 | 34 | 00 | 0100010 | 1010 | 101100 | 110 |
| 0 | 35 | 00 | 0100011 | 1010 | 101010 | 110 |
| 0 | 36 | 00 | 0100100 | 1010 | 101000 | 110 |
| 0 | 37 | 00 | 0100101 | 1010 | 100110 | 110 |
| 0 | 38 | 00 | 0100110 | 1010 | 100100 | 110 |
| 0 | 39 | 00 | 0100111 | 1010 | 100010 | 110 |
| 0 | 40 | 00 | 0101000 | 1010 | 100000 | 110 |
| 0 | -7 | 00 | 1111001 | 0110 | 10101 | 101 |
| 1 | -7 | 01 | 1111001 | 1000 | 101011 | 110 |
| 0 | -8 | 00 | 1111000 | 0111 | 111011 | 110 |
| 1 | -8 | 01 | 1111000 | 1010 | 111111 | 110 |
| 0 | -9 | 00 | 1110111 | 0111 | 110001 | 110 |
| 1 | -9 | 01 | 1110111 | 1010 | 111101 | 110 |
| 0 | -10 | 00 | 1110110 | 0111 | 100111 | 110 |
| 1 | -10 | 01 | 1110110 | 1010 | 111011 | 110 |
| 0 | -11 | 00 | 1110101 | 0111 | 100001 | 110 |
| 1 | -11 | 01 | 1110101 | 1010 | 111001 | 110 |
| 0 | -12 | 00 | 1110100 | 1000 | 110101 | 110 |
| 1 | -12 | 01 | 1110100 | 1010 | 110111 | 110 |
| 0 | -13 | 00 | 1110011 | 1000 | 110011 | 110 |
| 1 | -13 | 01 | 1110011 | 1010 | 110101 | 110 |
| 0 | -14 | 00 | 1110010 | 1000 | 110001 | 110 |
| 1 | -14 | 01 | 1110010 | 1010 | 110011 | 110 |
| 0 | -15 | 00 | 1110001 | 1000 | 101111 | 110 |
| 1 | -15 | 01 | 1110001 | 1011 | 100111 | 110 |
| 0 | -16 | 00 | 1110000 | 1001 | 111111 | 110 |
| 1 | -16 | 01 | 1110000 | 1011 | 100101 | 110 |
| 0 | -17 | 00 | 1101111 | 1001 | 111101 | 110 |
| 1 | -17 | 01 | 1101111 | 1011 | 100011 | 110 |
| 0 | -18 | 00 | 1101110 | 1001 | 111011 | 110 |
| 1 | -18 | 01 | 1101110 | 1011 | 100001 | 110 |

FIG. 27

| | | ADDRESS BIT | | VARIABLE-LENGTH CODE DATA BIT | | |
|---|---|---|---|---|---|---|
| | | 7-3 | 2-0 | 13-10 | 9-3 | 2-0 |
| RUN | LEVEL | RUN | LEVEL | NUMBER OF CONTINUING 0'S | REMAINING CODE | CODE LENGTH |
| 0 | -19 | 00 | 1101101 | 1001 | 111001 | 110 |
| 0 | -20 | 00 | 1101100 | 1001 | 110111 | 110 |
| 0 | -21 | 00 | 1101011 | 1001 | 110101 | 110 |
| 0 | -22 | 00 | 1101010 | 1001 | 110011 | 110 |
| 0 | -23 | 00 | 1101001 | 1001 | 110001 | 110 |
| 0 | -24 | 00 | 1101000 | 1001 | 101111 | 110 |
| 0 | -25 | 00 | 1100111 | 1001 | 101101 | 110 |
| 0 | -26 | 00 | 1100110 | 1001 | 101011 | 110 |
| 0 | -27 | 00 | 1100101 | 1001 | 101001 | 110 |
| 0 | -28 | 00 | 1100100 | 1001 | 100111 | 110 |
| 0 | -29 | 00 | 1100011 | 1001 | 100101 | 110 |
| 0 | -30 | 00 | 1100010 | 1001 | 100011 | 110 |
| 0 | -31 | 00 | 1100001 | 1001 | 100001 | 110 |
| 0 | -32 | 00 | 1100000 | 1010 | 110001 | 110 |
| 0 | -33 | 00 | 1011111 | 1010 | 101111 | 110 |
| 0 | -34 | 00 | 1011110 | 1010 | 101101 | 110 |
| 0 | -35 | 00 | 1011101 | 1010 | 101011 | 110 |
| 0 | -36 | 00 | 1011100 | 1010 | 101001 | 110 |
| 0 | -37 | 00 | 1011011 | 1010 | 100111 | 110 |
| 0 | -38 | 00 | 1011010 | 1010 | 100101 | 110 |
| 0 | -39 | 00 | 1011001 | 1010 | 100011 | 110 |
| 0 | -40 | 00 | 1011000 | 1010 | 100001 | 110 |

OTHER LEVEL RANGE (3)

FIG. 29

| SIGN BIT 1 | SIGN BIT 2 | SIGN BIT 3 | CONTROL OUTPUT | ERROR OUTPUT |
|---|---|---|---|---|
| 1 | 1 | 1 | 0 | 0 |
| 0 | 1 | 1 | 1 | 0 |
| 0 | 0 | 1 | 2 | 0 |
| 0 | 0 | 0 | 3 | 0 |
| OTHER COMBINATION | | | 0 | 1 |

FIG. 30

```
                    90
                  ┌─┴─┐
      FLAG         50
      VALUE    ┌───┴───┐      TABLE ADDRESS
        0     │ 0 │ 0 │ 0 │ RUN: 6 BITS     │ LEVEL: 2b │
        1     │ 0 │ 1 │ 0 │ RUN: 5 BITS     │ LEVEL: 3b │
        2     │ 1 │ 0 │ 0 │   RUN: 3b │ LEVEL : 4 BITS │
        3     │ 1 │ 1 │ RUN: 2b │   LEVEL: 7 BITS      │
```

FIG. 35

| DATA No. | RUN | LEVEL | VARIABLE-LENGTH CODE | NUMBER OF CONTINUING 0'S | REMAINING CODE | REMAINING CODE LENGTH |
|---|---|---|---|---|---|---|
| 1 | 0 | 0 | 110 | 0 | 110 | 3 |
| 2 | 0 | 1 | 01000 | 1 | 1000 | 4 |
| 3 | 0 | 2 | 001010 | 2 | 1010 | 4 |
| 4 | 0 | 3 | 00001100 | 4 | 1100 | 4 |
| 5 | 0 | 4 | 001001100 | 2 | 1001100 | 7 |
| 6 | 0 | 5 | 001000010 | 2 | 1000010 | 7 |
| 7 | 0 | 6 | 00000010100 | 6 | 10100 | 5 |

FIG. 36

STATE (1) OF CODE OUTPUT REGISTER

| | | 118a | 118b | 118c | 118d | 118e | CODE-LENGTH REGISTER |
|---|---|---|---|---|---|---|---|
| (a) | INITIAL STATE | 00000000 | 00000000 | 00000000 | 00000000 | 00000000 | 0 |
| (b) | DATA 1 INPUT | 11000000 | 00000000 | 00000000 | 00000000 | 00000000 | 3 |
| (c) | | 11000000 | 00000000 | 00000000 | 00000000 | 00000000 | 4 |
| (d) | DATA 2 INPUT | 11001000 | 00000000 | 00000000 | 00000000 | 00000000 | 8 |
| (e) | | 11001000 | 00000000 | 00000000 | 00000000 | 00000000 | 10 |
| (f) | DATA 3 INPUT | 11001000 | 00101000 | 00000000 | 00000000 | 00000000 | 14 |
| (g) | DATA OUTPUT | 00101000 | 00000000 | 00000000 | 00000000 | 00000000 | 6 |

FIG. 37

STATE (2) OF CODE OUTPUT REGISTER

|   | 118a | 118b | 118c | 118d | 118e | CODE-LENGTH REGISTER |
|---|------|------|------|------|------|----------------------|
| (a) | 00101000 | 00000000 | 00000000 | 00000000 | 00000000 | 10 |
| (b) DATA 4 INPUT | 00101000 | 00110000 | 00000000 | 00000000 | 00000000 | 14 |
| (c) DATA OUTPUT | 00110000 | 00000000 | 00000000 | 00000000 | 00000000 | 6 |
| (d) | 00110000 | 00000000 | 00000000 | 00000000 | 00000000 | 8 |
| (e) DATA 5 INPUT | 00110000 | 10011000 | 00000000 | 00000000 | 00000000 | 15 |
| (f) DATA OUTPUT | 10011000 | 00000000 | 00000000 | 00000000 | 00000000 | 7 |
| (g) | 10011000 | 00000000 | 00000000 | 00000000 | 00000000 | 9 |

FIG. 38

STATE (2) OF CODE OUTPUT REGISTER

|  | 118a | 118b | 118c | 118d | 118e | CODE-LENGTH REGISTER |
|---|---|---|---|---|---|---|
| (a) DATA 6 INPUT | 10011000 | 01000010 | 00000000 | 00000000 | 00000000 | 16 |
| (b) DATA OUTPUT | 01000010 | 00000000 | 00000000 | 00000000 | 00000000 | 8 |
| (c) | 01000010 | 00000000 | 00000000 | 00000000 | 00000000 | 14 |
| (d) DATA 7 INPUT | 01000010 | 00000010 | 10000000 | 00000000 | 00000000 | 19 |
| (e) DATA OUTPUT | 00000010 | 10000000 | 00000000 | 00000000 | 00000000 | 11 |
| (f) DATA OUTPUT | 10000000 | 00000000 | 00000000 | 00000000 | 00000000 | 3 |

VARIABLE-LENGTH CODE TABLE AND VARIABLE-LENGTH CODING DEVICE

BACKGROUND OF THE INVENTION

1. Field of the Invention

The present invention relates to a variable-length code table and a coding device for converting equal-length data, and in particular to a variable-length code table which is used in image compression processing for performing variable-length coding in a table look-up system as well as a variable-length coding device using the same.

2. Description of the Background Art

Image information contains a great quantity of information. For example, one frame (1/30 seconds) of television image requires image information of a quantity corresponding to that of test data for one copy of a book. Further, real time transmission is required for the image data in many cases, and it is very difficult to transmit in real time such a great quantity of information.

Accordingly, such a technique is used that image data is compressed prior to actual transmission, and the compressed data is transmitted and is expanded at a receiver side. Since this can reduce the quantity of transmitted signals, a larger quantity of information can be transmitted in the same time period via the same transmission path. Therefore, signal compression technique is very important in the field of image processing.

As a method for the above, there has been a so-called variable-length coding processing, according to which short codes are assigned to bit patterns frequently appearing in the image data to be transmitted and relatively long codes are assigned to less frequently appearing bit patterns. FIG. 1 shows an example of an image data compression processing device using such a variable-length coding processing. This device has been proposed in Japanese Patent Application No. 5-60335 (1993) by the same assignee as the present application. In this example, there is shown a processing diagram of the image compression using the coding system specified by the MPEG standard.

Referring to FIG. 1, image data ID to be compressed is supplied to a DCT (Discrete Cosine Transform) processing device 202 via a subtracter 200 and a selector 218. DCT processing device 202 converts the input signal into frequency components. The signal processed by DCT processing device 202 is further quantized by a quantizer 204. The quantization relatively reduces the components at a high-frequency region of the data converted into frequency components by the DCT processing. This does not cause remarkable reduction of the image quality for human eyes, and thus is performed for reducing the quantity of data to be transmitted by removing high-frequency components.

The quantized data (i.e., run length data) is supplied to a variable-length coding unit 206 which performs variable-length coding on the data. The coded data is output as compressed image data VD via a buffer 208.

An output of quantizer 204 is also supplied to an inverse quantizer 210 and an inverse DCT processing unit 212. Inverse quantizer 210 and inverse DCT processing unit 212 are provided for predicting motion which will be described later. An output of inverse DCT processing unit 212 is also supplied to an adder 214.

Image data ID is also supplied to a motion predicting unit 216. Motion predicting unit 216 predicts, for example, the motion of image between frames and transmits information related only to the moving image for flattening data and allowing further compression so as to reduce the transmission quantity. The data after processing of prediction is supplied to adder 214.

The output data of adder 214 is supplied to subtracter 200 and motion predicting unit 216 via a selector 220. Owing to selecting operation of selectors 218 and 220, image compression is performed taking the prediction of motion into account.

FIG. 2 is a schematic block diagram of variable-length coding unit 206 shown in FIG. 1. Referring to FIG. 2, run length data of, e.g., 8 bits supplied from quantizer 204 in FIG. 1 is converted into run data and level data by a run length converter 236. These data are equal-length data. The level data represents the level of run length data other than 0. The run data represents the number of data of 0 following the data other than 0. As described before, the high frequency component contains many 0's owing to the DCT processing and quantization. Therefore, compression can be performed efficiently using the run length conversion. The run data and level data are supplied to a data RAM (Random Access Memory) 238 for run length data, and are supplied to a run length data to variable-length code converting unit 240 after being converted into the form of (run, level). Run length data to variable-length code converting unit 240 converts the (run, level) data into variable-length codes for supplying the same to a multiplexer 242. Run length data to variable-length code converting unit 240 will be detailed later.

Meanwhile, control information including compression method and data size is supplied to a data RAM 232 for a header. Data which is read from header data RAM 232 using the above control information as an address is supplied to a header producing unit 234. Header producing unit 234 and run length data to variable-length code converting unit 240 supply control signals to data RAM 232 for header and data RAM 238 for run length data, and thereby read data therefrom, respectively.

Header producing unit 234 outputs the header of data, and run length data to variable-length code converting unit 240 outputs variable-length-coded data. Multiplexer 242 selects the output of header producing unit 234 and the output of run length data to variable-length code converting unit 240 in accordance with a select signal sent from a whole control circuit 230, and supplies the same to an FIFO buffer 244.

FIFO buffer 244 buffers the output of multiplexer 242 in the FIFO manner in response to the control signals sent from header producing unit 234 and run length data to variable-length code converting unit 240, and outputs the same in response to an output request signal sent from a parallel/serial (P/S) interface 246. FIFO buffer 244 is provided for making adjustment between a processing speed of variable-length coding unit 206 and a speed of external output of data.

Parallel/serial interface 246 is responsive to the control signal sent from buffer 208 shown in FIG. 1 and supplies the data to buffer 208 in accordance with the same clock signal.

The whole control circuit 230 is provided for controlling various portions and units in variable-length coding unit 206 so as to multiplex the header information and the data on a time axis in accordance with the standard used in variable-length coding.

FIG. 3 schematically shows a structure of run length data to variable-length code converting unit 240. Referring to FIG. 3, run length data to variable-length code converting unit 240 includes a memory 250 storing a variable-length code table which is accessed using the run data and the level data as an address for outputting the corresponding variable-length code and its code length, a variable-length code generating circuit 252 for generating a variable-length code based on the data read from memory 250, and a control circuit 254 which controls reading from memory 250 and operation of variable-length code generating circuit 252 in accordance with the control signal sent from whole control circuit 230 (FIG. 2), while supplying control signals to neighboring circuits.

Referring to FIG. 4, the variable-length code table in memory 250 includes a plurality of variable-length code data 266 arranged at corresponding addresses. Each variable-length code table 266 includes a variable-length code region 268 of a 17-bit width storing variable-length codes corresponding to combination of given (run, level), and a code length region 270 of a 5-bit width storing information which specifies a length of the variable-length code stored in variable-length code region 268.

Address 260 for accessing variable-length code data 266 includes a run region 262 of 6 bits and a level region 264 of 7 bits, and thus includes 13 bits. The address is produced from the run data and level data supplied from the preceding stage as shown in FIG. 3, and variable-length code table memory 250 is accessed with the produced address for outputting the corresponding variable-length code data.

In address 260, 6 bits are allocated to run 262 and 7 bits are allocated to level 264 because a range of the run is from 0 to 63 and a range of the level is between ±41 so that 6 bits and 7 bits are required for representing them, respectively. FIGS. 5 to 10 show DCT output coefficient variable-length code tables of MPEG1. These tables shows all the major data.

As can be seen from FIGS. 5 to 10, the variable-length code region 268 is formed of 17 bits and code length region 270 is formed of 5 bits because the maximum length of the variable-length code is 17 bits. Code length region 270 is required because the code length is required even for handling the variable-length code and the code length of the variable-length code must be output together with the variable-length code.

Combinations of the run and level not mentioned in the tables in FIGS. 5 to 10 are processed by a coding unit (not shown) other than the above variable-length coding unit.

FIG. 11 is a block diagram showing the variable-length coding device using the conventional variable-length code table and also showing variable-length code table memory 250 and control circuit 254. Referring to FIG. 11, conventional variable-length coding device 252 includes a register 282, a 40-bit barrel shifter 104, a shift register 118 for outputting the variable-length code, a zero generating circuit 120, a register 108, 5-bit adder 112 and a code length register 114. Shift register 118 includes five 8-bit registers 118a–118e.

Control circuit 254 supplies control signals a, b, d, f and g to variable-length code table memory 250, register 108, register 282, variable-length register 114 and shift register 118 for operating them, respectively.

In the initial state, shift register 118 outputting the variable-length code and variable-length register 284 both have been cleared to 0. Forty-bit barrel shifter 104 is operable to shift the input data by a value indicated by code length register 114 and store the same in shift register 118.

Initially, the variable-length code and the code length in variable-length code table are stored in registers 282 and 114, respectively. It is assumed that the variable-length code thus stored is "001010" and the code length thus stored is "6". These values are supplied from registers 282 and 108 to 40-bit barrel shifter 104 and 5-bit adder 112, respectively.

The content of variable-length register 284 is 0. Therefore, 40-bit barrel shifter 104 passes the input data therethrough without shifting it, and supplies the input data to shift register 118 for code output.

Five-bit adder 112 adds the input data "6" and the content "0" of code length register 114 together, and writes the result "6" into the code length register 114. Code length register 114 is operable to supply a control signal h to shift register 118 for shifting the same and also supplies it as a data enable signal to a circuit at a subsequent stage, when the value stored in register 114 increases to or above 8. In this case, however, the content is "6", so that shift signal h is not output.

Then, it is assumed that a coded variable-length code of "00001000" is supplied to 40-bit barrel shifter 104 via register 282, and a code length "8" is supplied to the input of 5-bit adder 112 via register 108.

The content of code length register 114 is "6". Forty-bit barrel shifter 104, therefore, shifts the variable-length code by 6 bits to the right, and stores the same in shift register 118. At this time, the stored content of shift register 118 for outputting the code is formed of the initially supplied variable-length code stored at 6 bits starting from the highest bit. The currently supplied (i.e., second) variable-length code is stored at 7th and succeeding bits.

Five-bit adder 112 adds the input data "8" and the content "6" of code length register 114 together, and writes the result "14" into code length register 114.

Code length register 114 outputs shift signal h and equally divides its own content into eight, because the content has increased to 8 or more. Shift register 118 for outputting the code responds to shift signal h by shifting its contents by 8 bits to the left and outputting the content of shift register 118a as coded data (bit stream) from its left end. Thus, the content of 8-bit register 118a is output as the data, and the contents of registers 118b, 118c, 118d and 118e are transferred to registers 118a, 118b, 118c and 118d, respectively. Also, 0's of 8 bits are supplied and written into register 118e from zero generating circuit 120.

As a result of the above processing, the content of code length register 114 goes to "6". In this case, the content of code length register 114 represents the bit number of variable-length code "001000" stored in 8-bit register 118a. Thus, code length register 114 stores a data length of effective data stored in code outputting shift register 118.

When a next variable-length code is input, the input variable-length code is shifted to the right by a bit number of the variable-length code stored in 8-bit register 118a, and then is stored in shift register 112, so that shift register 118 for outputting code stores the next variable-length code at places immediately succeeding those of the variable-length code already stored in shift register 118.

The above processing is repetitively performed on the variable-length code and its code length sent from memory 250, and a variable-length code train is produced in the form of a bit stream.

The image compressing device in a related art flattens the data itself by predicting motion, and further performs the DCT processing and quantization for removing high-frequency components. Therefore, image signals to be compressed contains a large number of 0's, and can be compressed efficiently by using the variable-length code tables, e.g., shown in FIGS. 5 to 10. Since the table look-up system is used, complicated processing is not necessary, and fast coding processing can be performed.

However, the variable-length coding device using the table look-up system described above suffers from a disadvantage that a large memory is required. As can be seen from FIGS. 5 to 10, the variable-length codes have code lengths in a range from 2 to 17 bits. However, when preparing the variable-length code tables in the memory, it is difficult to set the length of variable-length code region itself to an arbitrary bit length, so that a field of a fixed length fitted to the maximum code length must be assigned to each variable-length code data. In order to represent one variable-length code, therefore, data of 22 bits (variable-length code of 17 bits and code length of 5 bits) is required. In order to develop this variable-length code table on the memory, it is necessary to provide a memory of at least 8 kilowords (address space of 13-bit address)×22 bits.

In particular, the variable-length code tables shown in FIGS. 5 to 10 provide only two hundred-odd kinds of combinations of the run and level to be processed, but the space of 8 kilowords is required for developing the tables on the memory. Therefore, the variable-length coding processing has been desired that can utilize the memory space more efficiently and can reduce the required memory.

A proposal for achieving the above object is disclosed in Japanese Patent Laying-Open No. 4-142163 (1992). According to the disclosure of this publication, attention is paid to the fact that a certain repetition pattern (e.g., of "0") is often found at a leading portion of the variable-length code, and the variable-length code is converted into a number of repetition of the repetitive pattern starting from the leading end, the remaining data and the length of remaining data for storing the same. When accessing the memory, the variable-length code is produced by adding certain characters (e.g., 0's) equal in number to the repetition number of repetitive pattern to the leading end of the remaining data.

According to this manner, the repeated 0's starting from the leading end can be represented by a small number of bits. For example, 2 bits can represent the repetition number from 0 to 3, 3 bits can represent the repetition number from 0 to 7, and 4 bits can represent the repetition number from 0 to 15. This reduces the total bit length required for representing the variable-length code. Since the required bit length per address of memory is reduced, the whole capacity of memory can be reduced.

Even if this technique is used, however, a large unused region still remains in the memory. It is desired to utilize such a region efficiently. Further, the unused region must be utilized without losing convenience of the table look-up system.

SUMMARY OF THE INVENTION

Accordingly, it is an object of the invention to reduce a capacity of a memory required for a variable-length code table.

Another object of the invention is to provide a variable-length code table allowing further reduction of a required capacity of a memory.

Still another object of the invention is to reduce a memory capacity required by a table for producing binary variable-length codes as compared with the prior art.

An additional object of the invention is to achieve a table, which is used for converting run data and level data into binary variable-length codes in the image compression coding standard MPEG, with a memory of a reduced capacity.

Another additional object of the invention is to achieve a table, which is used for converting run data and level data into binary variable-length codes in the image compression coding standard H261, with a memory of a reduced capacity.

It is also an object of the invention to provide a variable-length coding device requiring a memory of a reduced capacity.

It is further an object of the invention to provide a variable-length coding device requiring a memory of a further reduced capacity.

An additional object of the invention is to provide a variable-length coding device requiring a memory of a further reduced capacity and allowing fast production of a variable-length code.

A variable-length code table according to the invention is used for producing a variable-length code from data formed of one set of first and second equal-length components each taking a value in a given range. The variable-length code table stores at an address uniquely assigned by the one set of the equal-length components a corresponding variable-length code and a code length of the variable-length code. Combinations of the first and second equal-length components are predetermined in number and finite, and the manner of combination is preselected such that the maximum value of the absolute value of the first equal-length component increases as the absolute value of the second equal-length component combined therewith decreases. The second equal-length components are classified into a plurality of classes in accordance with the magnitude of the absolute value. Each address includes a first region having a value and a length uniquely specified based on the class including the second equal-length component, a second region storing the first equal-length component, and a third region storing the second equal-length component, and is constructed to have a fixed length as a whole. Region lengths of the second and third regions are determined correspondingly to the class including the second equal-length component, and each are specifically determined to have the minimum value required for storing the maximum values of the absolute values of the first and second equal-length components of the combinations of the equal-length components included in the corresponding class.

In this variable-length code table, comparison may be made between the first combination including the second equal-length component belonging to a given class and the second combination including the second equal-length component belonging to a class larger in absolute value than the above given class in connection with the size of the third region for the second equal-length component at each address, which shows the fact that the size in the second combination is larger than that in the first combination. However, the size of the second region for the first equal-length component can be small in the second combination. Therefore, the whole region length can be fixed. If such classification were not made, each of the second and third regions would be required to have a size enough to store the maximum value of the absolute value of the first equal-length component and the maximum value of the absolute value of the second equal-length component, so that the address length would increase as a whole. According to the invention, therefore, the address length required for table access is reduced. This allows reduction of the capacity of the memory for the variable-length code table.

Preferably, the variable-length code is formed of the number of given first characters continuing from the leading end and a remaining code, and the code length is the code length of the remaining code. Although the region representing the number of the leading and continuing first characters has the fixed length, the number of the characters equal to Nth power of 2 can be represented where N is the bit number. Therefore, in the variable-length coding system in which many of the variable-length codes contain the leading and continuing first given characters larger in number than the Nth power of 2, the data length representing the variable-length code stored at each address in the table can be reduced as compared with the case where the above construction is not employed. This effect becomes more remarkable in accordance with increase of the number of variable-length codes having the same leading and continuing characters which are larger in number than the Nth power of 2. This allows further reduction of the capacity of memory required for the variable-length code table.

If the variable-length code table is used in the image compression coding standard MPEG, the first equal-length component is run data, and the second equal-length component is level data. If the variable-length code table is used in the image compression coding standard H261, the first equal-length component is run data, and the second equal-length component is level data.

Another aspect of the invention provides a variable-length coding device for producing a variable-length code from data formed of one set of first and second equal-length components using the variable-length code table of the above aspect. The variable-length coding device further includes an address converting circuit for receiving one set of the equal-length components and performing conversion of the address correspondingly to the one set of the equal-length components based on a class of the second equal-length component included in the one set of the equal-length components and the one set of the equal-length components to supply the same to the variable-length code table.

According to this device, the address required for table access can be produced by the address converting circuit. Since the device uses the variable-length code table of the invention, the address length required for the table address can be short. Therefore, a required capacity of a memory can be small.

Still another aspect of the invention provides a variable-length coding device for producing a variable-length code from data formed of one set of first and second equal-length components using the variable-length code table of the above aspect. The variable-length coding device further includes an address converting circuit for receiving one set of the equal-length components and performing conversion of the address correspondingly to the one set of the equal-length components based on a class of the second equal-length component included in the one set of the equal-length components and the one set of the equal-length components to supply the same to the variable-length code table, and a character adding circuit operable based on the number of leading and continuing first characters of the variable-length code output from the variable-length code table, a remaining code of the same and a code length of the remaining code to output a variable-length code including the first characters equal in number to the first characters to the leading end of the remaining code.

According to this device, the address converting circuit can produce the address required for accessing the table, and can output the variable-length code based on the number of the leading and continuing given first characters, the remaining code and the code length of the remaining code which are obtained as a result of the table access. Since the device uses the variable-length code table of the above aspect of the invention, the address length required for the table address can be shorter than that in the prior art, and the data length stored at each address can be reduced. Therefore, a required capacity of a memory can be small.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 10 show variable-length code tables of a DCT output coefficient of MPEG1;

FIG. 13 shows combinations of run and level data of the DCT output coefficient of MPEG1 in a form of a table in which the combinations are divided into classes based on the range of level;

FIG. 14 schematically shows an address construction for producing addresses for respective level ranges;

FIGS. 15 and 16 show variable-length code tables of a DCT output coefficient of H261;

FIG. 18 shows contents of distribution shown in FIG. 17 divided into classes based on the level range in a table form;

FIG. 19 schematically shows a method of producing an address;

FIGS. 21 to 27 show variable-length code tables of a DCT output coefficient of MPEG1;

FIG. 29 shows operation of a logic circuit;

FIG. 30 schematically shows a method of producing an address in an embodiment of the invention;

FIG. 35 shows an example of a series of data to be variable-length-coded; and

FIGS. 36 to 38 show change of contents of a shift register for outputting a code.

DESCRIPTION OF THE PREFERRED EMBODIMENTS

Figure 12:
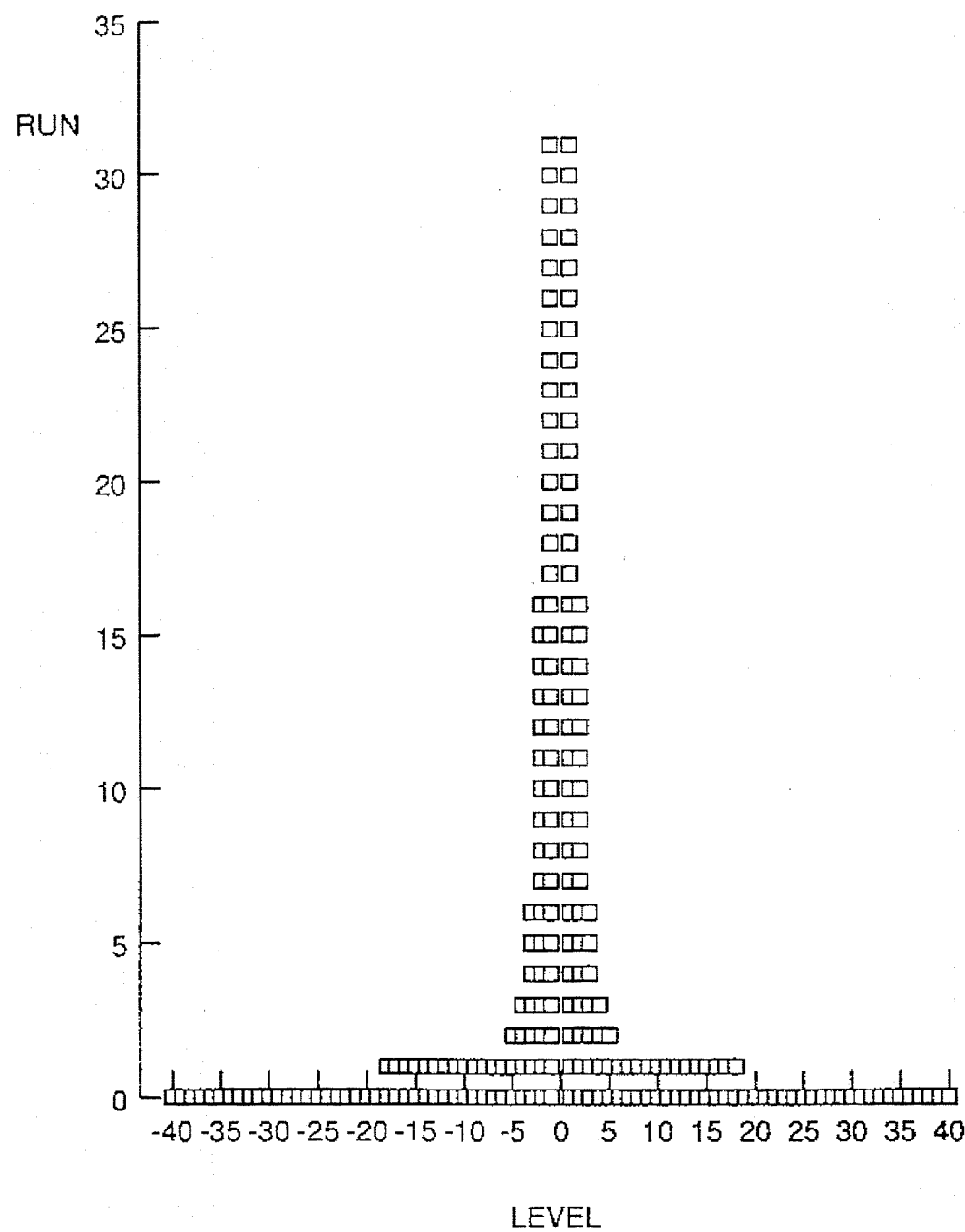
FIG. 12 is a graph showing distribution of combinations of run and level data of the DCT output coefficient of MPEG1.

The present invention utilizes the fact that a particular relationship exists in combinations of run data and level data which are predetermined, for example, in connection with a DCT output coefficient of MPEG1. FIG. 12 shows distribution of the (run, level) combinations of the DCT output coefficient of MPEG1. The abscissa indicates the level, and the ordinate indicates the run. In an area of a small absolute value of the level, as can be seen from FIG. 12, the runs combined with such levels are distributed in a range from 0 to 31. As the absolute value of level increases, the number of runs combined with the levels decrease, and the absolute values thereof also decrease. In an area of a large absolute value of the level, the runs of only one value, i.e., "0" exist.

Combinations of level and run shown in FIG. 12 can be classified based on the range of level as show in a table of FIG. 13. According to the classification shown in FIG. 13, there are four divided ranges, i.e., ranges from −1 to 1, of −2 and 2, and from −6 to −3 and from +3 to +6, and a range other than these. Each of these ranges determined based on the level is referred to as a "class" in the present specification.

As can be seen from FIG. 13, in a range of level from −1 to +1, the maximum value of the run combined with the level is 31. The absolute values of the levels belonging to this class are 0 and 1. Therefore, the run data combined with the level belonging to this class can be represented with 6 bits, and the level data can be represented with 2 bits.

In a range of level of −2 and +2, runs combined with this level ranges from 0 to 16. The absolute value of the level is 2. Therefore, the run combined with the level belonging to this class can be represented with 5 bits, and the level can be represented with 3 bits. Likewise, in the level range from −6 to −3 and from +3 to +6, the run can be represented with 3 bits, and the level can be represented with 4 bits. In the case other than the above, the run can be represented with 2 bits, and the level can be represented with 7 bits.

Therefore, as shown in FIG. 14, one can change the construction of the address for accessing the variable-length code table in accordance with the range of level. More specifically, 6 bits and 2 bits are assigned to the run data and the level data in the level range from −1 to +1, respectively. In the range of level of −2 and +2, 5 bits and 3 bits are assigned to the run data and the level data, respectively. In the range from −6 to −3 and +3 to +6, 3 bits and 4 bits are assigned to the run data and the level data, respectively. In the range other than the above, 2 bits and 7 bits are assigned to the run data and the level data, respectively.

Figure 4:
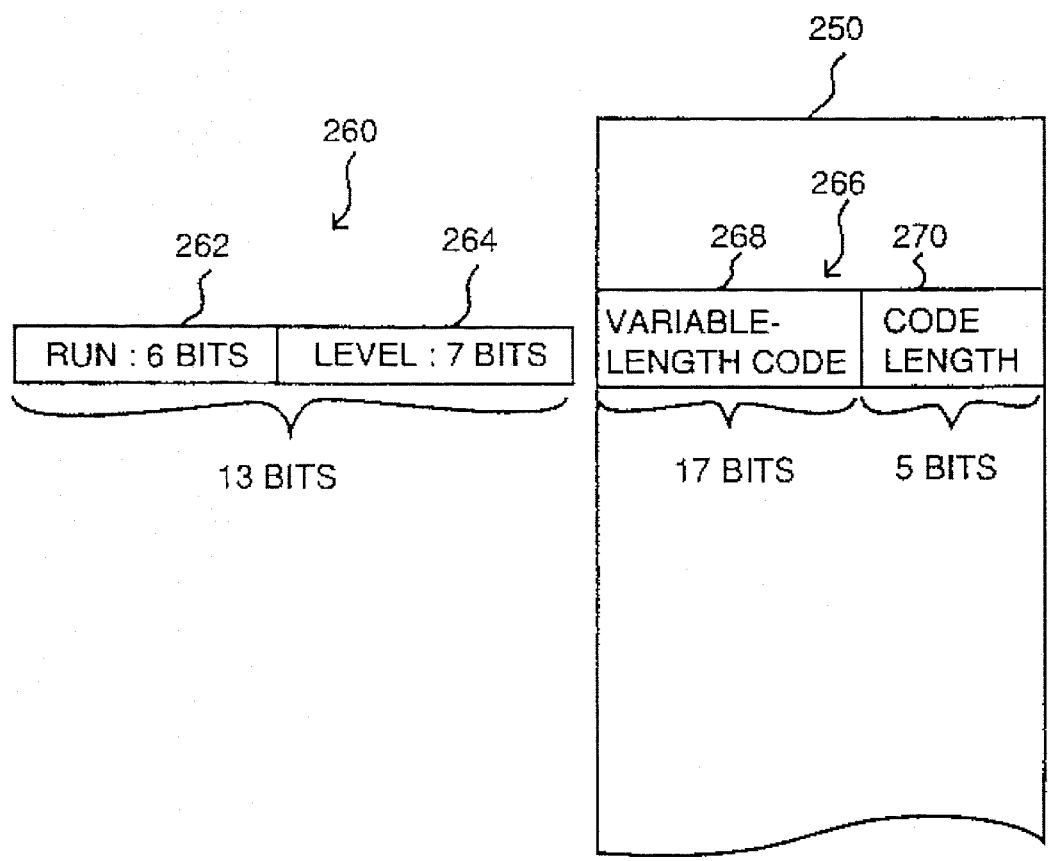
FIG. 4 schematically shows a construction of a variable-length code table in the related art.

When the address is changed as described above, inconvenience arises if memory regions represented by the addresses overlap with each other. Therefore, the leading 2-bit region of the address is used as a flag 50, and 00, 01, 10 and 11 are assigned to the respective classes (level ranges). By preparing the addresses in this manner, the whole address length can be 11 bits at the most. If classification is not performed in this manner, 13 bits are required for the address as already described (see FIG. 4). Therefore, it can be understood that the address space can be reduced to approximately a quarter owing to the address construction shown in FIG. 14.

Figure 17:
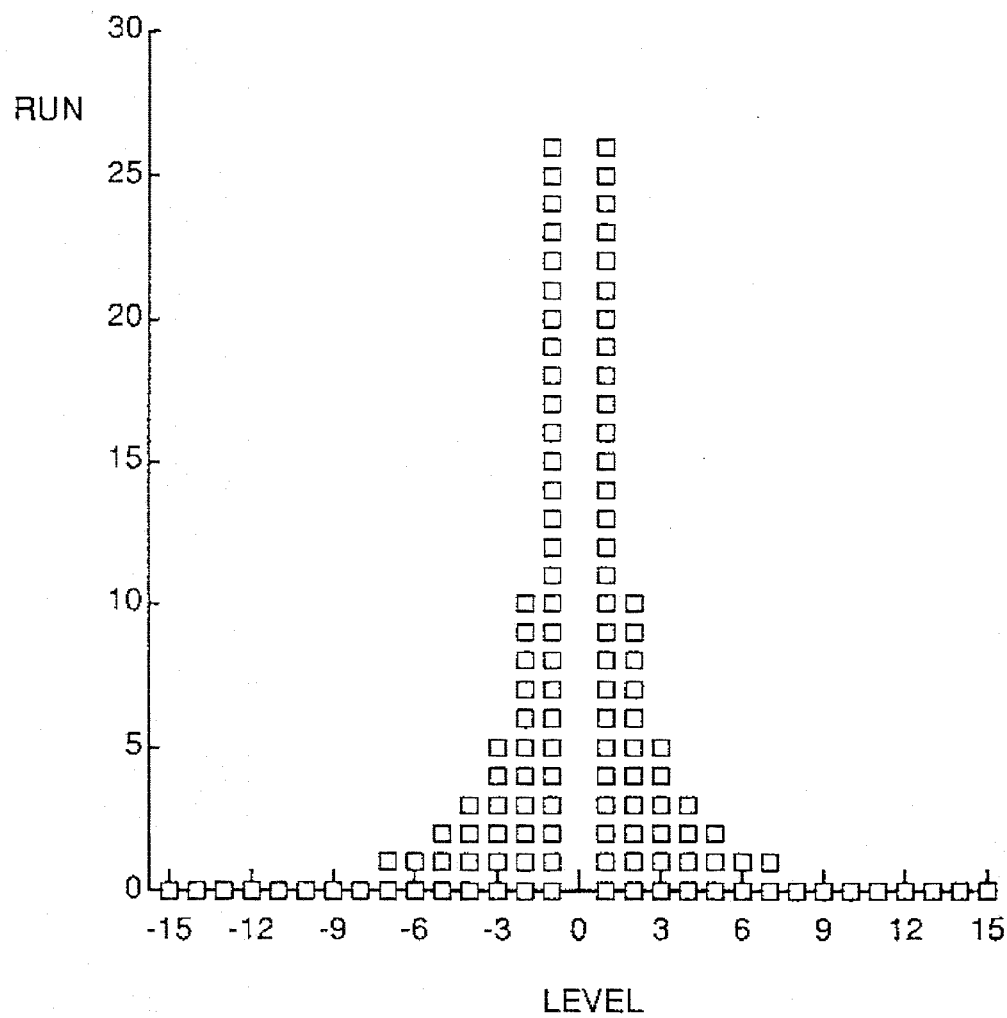
FIG. 17 shows distribution of combination of run and level shown in FIG. 6.

The foregoing can be similarly applied to another image coding standard. FIGS. 15 and 16 show variable-length code tables of a DCT output coefficient of H261. In FIGS. 15 and 16, "s" represents a sign. More specifically, s is "0" when the level data is positive, and is "1" when negative. Distribution of the combination of run and level is shown in a diagram of FIG. 17. In FIG. 17, the abscissa indicates the level, and the ordinate indicates the run. Also in the combination of DCT output coefficients of H261, as can be seen from FIG. 17, the maximum value of run data is large when the absolute value of level is small, and the absolute value of run data decreases as the absolute value of level combined therewith increases.

FIG. 18 shows a table in which the DCT output coefficients of H261 are classified. As can be seen from FIG. 18, there are classes corresponding to the level ranges of 0 and 1, between 2 and 7, and of 8 or more, in which case the bit numbers of 7, 7 and 8 are required for representing the combination of run and level.

FIG. 19 shows a manner of producing the address for accessing the DCT output coefficient table of H261 based on the result of FIG. 18. In this case, flag regions 52 are likewise provided for preventing overlapping of the regions for variable-length codes belonging to the respective classes. "00" is assigned to the class of the levels of 0 and 1, "01" is assigned to the class of the levels from 2 to 7, and "1" is assigned to the class other than the above. Thereby, the run and level in the classes of the levels of 0 and 1 and the levels from 2 to 7 can be represented with 7 bits. In the class other than the above, the run and level can be represented with 8 bits. Therefore, it can be understood that the variable-length codes in all the level ranges can be mapped with only 9 bits in total at ranges which do not overlap with each other.

The same concept can be applied also to processing for converting macro block address increment data and motion code into variable-length codes in image compression coding standards MPEG and H261 as well as processing for converting data of combination of (run, level) into variable-length codes in JPEG. Although the following description will be given on a device and a table construction for converting the combination data of (run, level) into variable-length codes in MPEG1, it will be readily understood to those skilled in the art according to the description of the present specification that tables for the respective kinds of conversion described above can be formed according to the similar concept and that variable-length coding devices can be formed using such tables.

Figure 1:
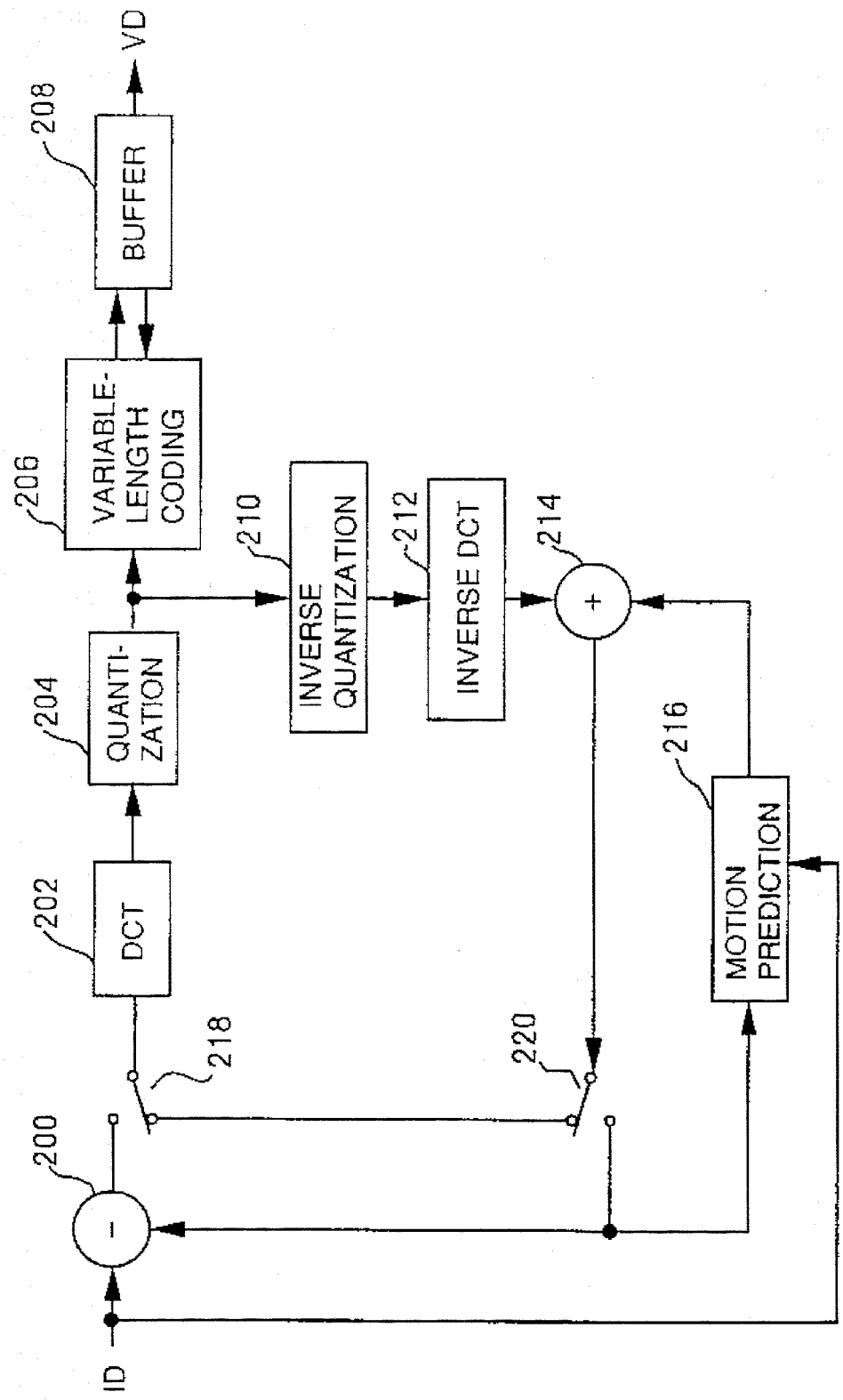
FIG. 1 is a process diagram of image compression processing.
Figure 2:
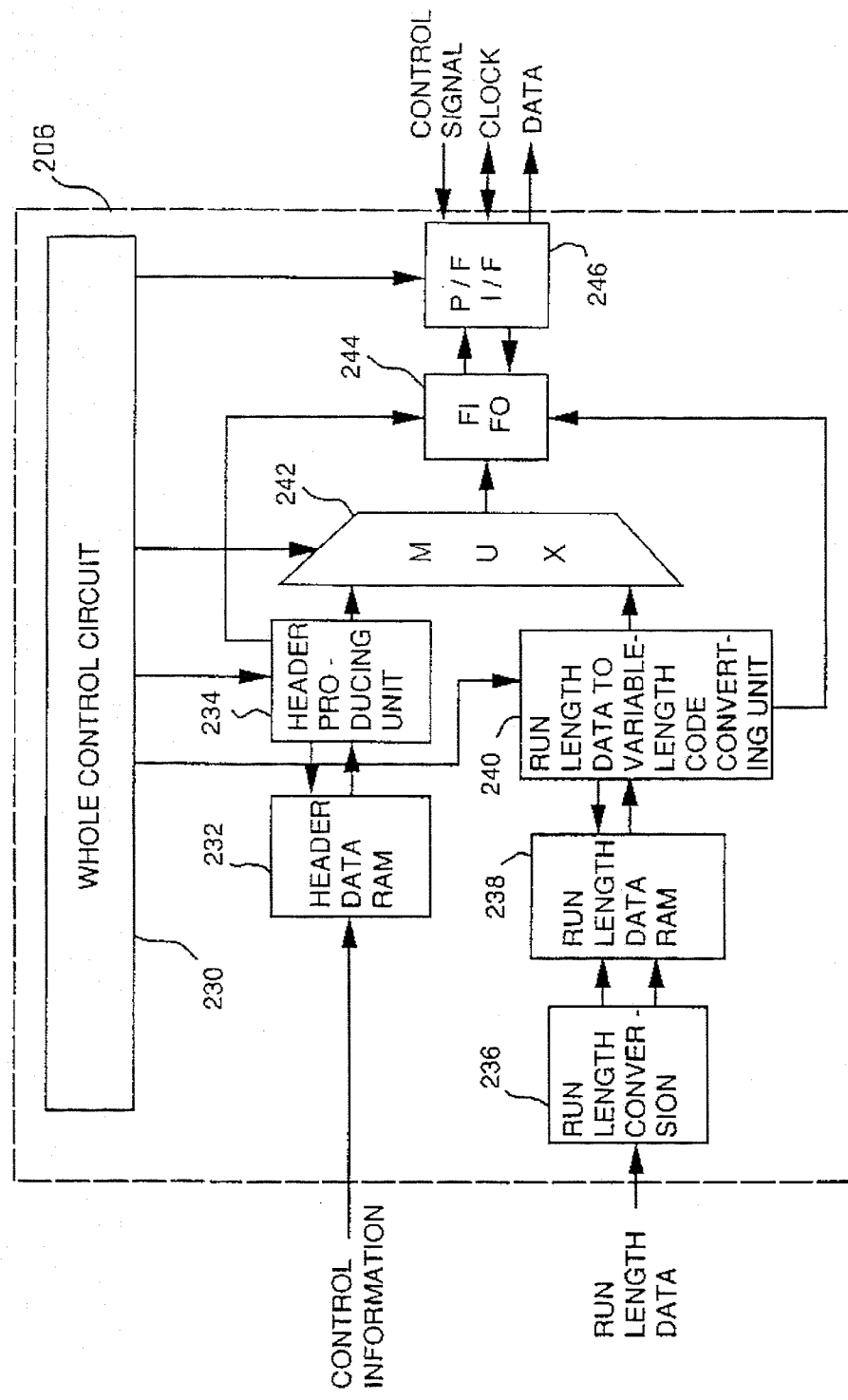
FIG. 2 is a block diagram of a variable-length coding device.
Figure 3:
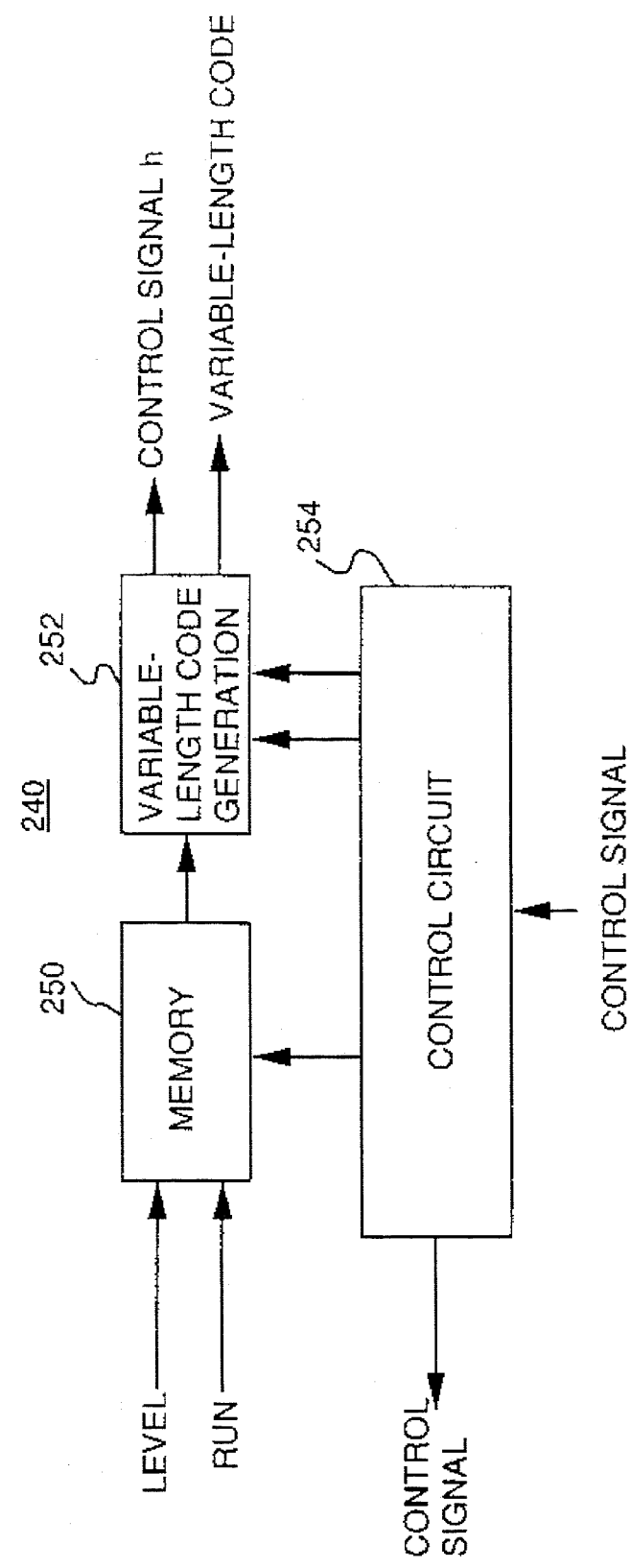
FIG. 3 is a block diagram of a run length data variable-length coding device in a related art.
Figure 20:
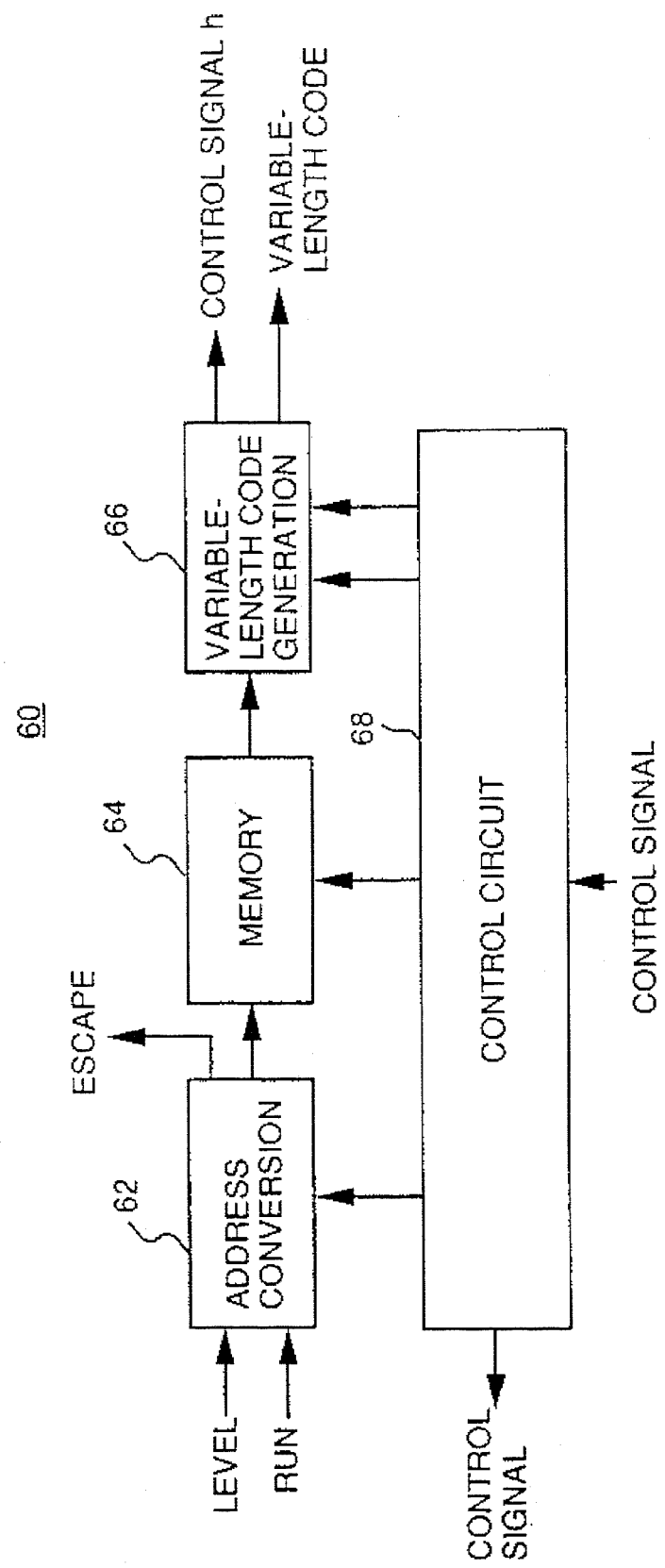
FIG. 20 is a block diagram showing a run length data variable-length coding unit of an embodiment of the invention.

A run length data variable-length code converting unit 60 shown in FIG. 20 can be used in variable-length coding unit 206 instead of run length data variable-length code converting unit 240 in the related art already described with reference to FIG. 2. Referring to FIG. 20, run length data variable-length code converting unit 60 includes an address converting circuit 62, a memory 64 storing a variable-length code table according to the invention, a variable-length code generating circuit 66 which is operable based on data indicating the number of leading and continuing 0's of the variable-length code supplied from memory 64, the remaining code thereof and the code length of the remaining code, to add the specified number of 0's to the leading end of the remaining code for outputting the variable-length code, and a control circuit 68 for controlling operation of address converting circuit 62, memory 64 and variable-length code control circuit 66.

Address converting circuit 62, of which specific structure will be described later, receives run data and level data for producing and supplying the address to memory 64 in the manner shown in FIG. 14. Address converting circuit 62 outputs an escape signal when it detects a combination of (run, level) other than those specified by MPEG1. When this escape signal is output, coding of the (run, level) data is performed in accordance with another manner. A unit for this purpose is not shown in the figure.

Contents of the variable-length code table stored in memory 64 are shown in FIGS. 21 to 27. FIGS. 21 and 22 show combinations of (run, level) belonging to the class of the level range from −1 to +1, FIG. 23 show combinations of (run, level) belonging to the class of the level range of −2 and +2, and FIG. 24 show combinations of (run, level) belonging to the classes of the level range from −6 to −3 and from +3 to +6. FIGS. 25 to 27 show combinations of (run, level) in the range other than the above.

For example, referring to FIG. 21, in the level range belonging to the class from −1 to +1, the whole bit width of address bits is 7 bits, among which bits from 7th to 2nd places represent the run data, and 1st and 0th bits represent the level data. Likewise, referring to FIG. 23, in the level range of −2 and +2, bits from the 7th to 3rd places of the address bits represent the run data, and bits from 2nd to 0th places represent the level data. In the level ranges from −6 to −3 and from +3 to +6, bits from the 7th to 4th places of the-address bits represent the run data, and bits from 3rd to 0th places represent the level data. In the range other than the above, bits at the 8th and 7th places of the address bits represent the run data, and bits from 6th to 0th places represent the level data.

Referring again to FIG. 21, data bits from 13th to 10th places represent the number of leading and continuing 0's in the variable-length code corresponding to the (run, level). Bits from 9th to 3rd places represent the remaining code, i.e., code from which the leading and continuing 0's are removed. Bits from 2nd to 0th places represent a code length of the remaining code. For example, referring to FIG. 5, when the run is 3 and the level is 1, the corresponding variable-length code is "001110". This can be expressed in the form according to the invention, in which case, as shown at the row of run of 3 and level of 1 in FIG. 21, the data bits from 13th to 10th places represent "0010" in binary and hence "2" in decimal, and the bits from 9th to 3rd places represent the remaining code of "1110". The code length of remaining code is 4, and can be represented in binary as "100" as shown in FIG. 21. Combinations of other runs and levels can be represented in a similar manner.

Figure 28:
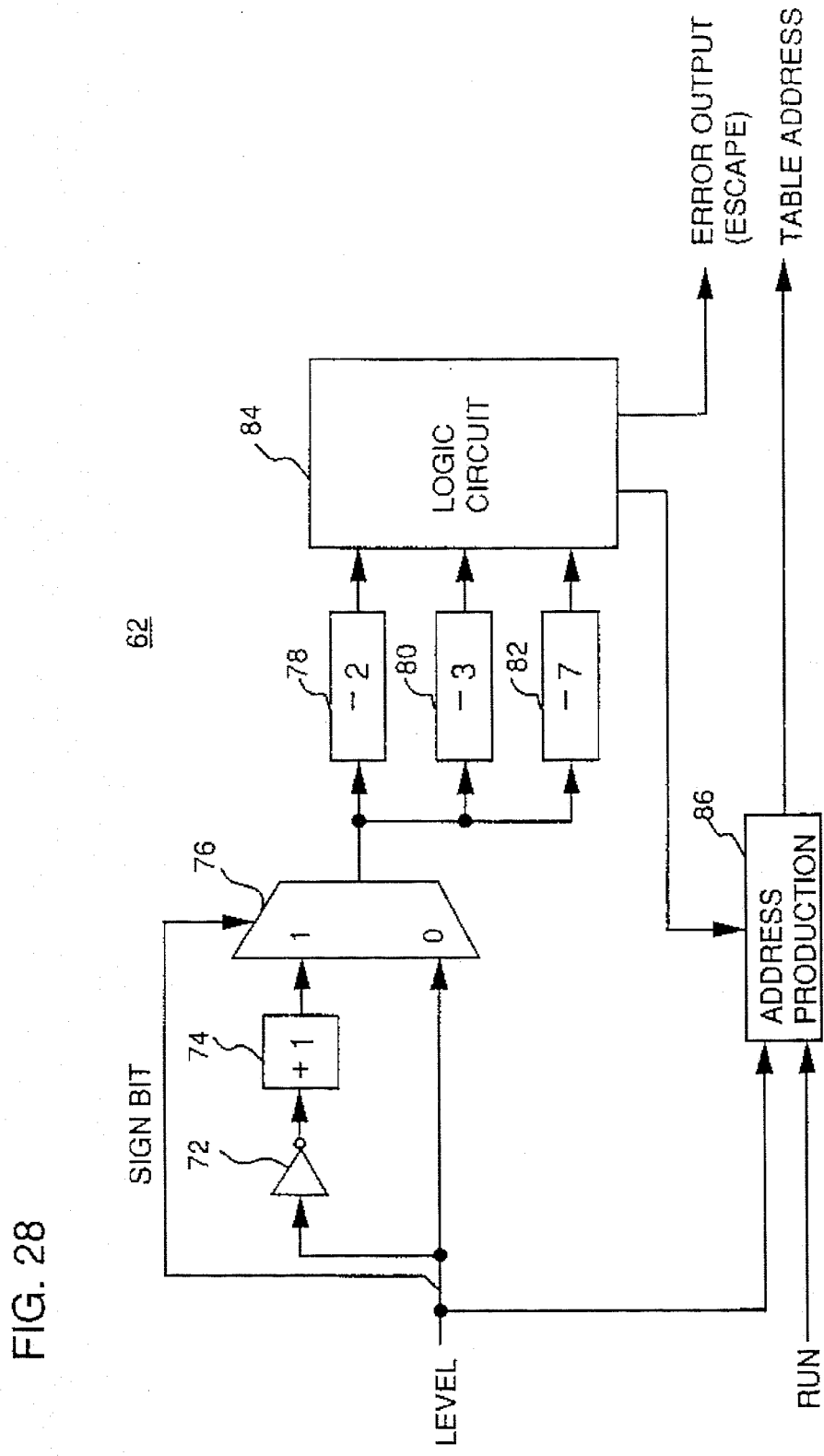
FIG. 28 is a block diagram of an address converting circuit in an embodiment of the invention.

FIG. 28 specifically shows address converting circuit 62 in FIG. 20. Referring to FIG. 28, address converting circuit 62 includes an inverter circuit 72 for producing an absolute value of the level data, an 1-bit adder 74, a multiplexer 76, comparators 78, 80 and 82 for comparing a magnitude of the absolute value of level data supplied from multiplexer 76 with 2, 3 and 7, respectively, a logic circuit 84 which outputs a signal for determining the manner of combination of address production by performing a logical operation on the outputs of comparators 78, 80 and 82, and an address producing circuit 86 which produces an address based on the output of logic circuit 84 and received level data and run data. When level data outside the predetermined ranges is detected, logic circuit 84 outputs an error which is sent as an escape signal (see FIG. 20).

Inverter circuit 72 and 1-bit adder 74 are provided for the case where received level data is a negative number, and operate to produce a number by inverting the sign of the negative number. Multiplexer 76 outputs the output of adder 74 when the sign bit of level data is 1 (negative), and outputs the received level data when it is 0 (positive).

FIG. 29 shows the operation of logic circuit 84 shown in 28 in a form of table representing the output with respect to combination of inputs. In FIG. 29, sign bits 1, 2 and 3 represent the outputs of comparators 78, 80 and 82, respectively, and more specifically, represent the sign bits formed by subtracting 2, 3 and 7 from the absolute value of level data.

The case where all sign bits 1–3 are 1 means that the absolute value of level data is smaller than 2. This corresponds to the case where the level range is from −1 to +1 as shown in FIG. 14. In this case, the control output is set to 0. The case where sign bits 1–3 are 0, 1 and 1, respectively, corresponds to the case where the absolute value of level is 2, and the control output is set to 1. The case where sign bits 1–3 are 0, 0 and 1, respectively, corresponds to the level range from −6 to −3 and from +3 to +6, in which case the control output is set to 2. The case where all sign bits are 0 corresponds to the case where the absolute value of level is larger than 6. In this case, the control output is set to 3. These control outputs can be represented in binary as "00", "01", "10" and "11". These are equal to flags 50 shown in FIG. 14, so that flags 50 can be used as they are to produce addresses as shown in FIG. 30. Logic circuit 84 is constructed to set the error output to 0 when combination of sign bits in FIG. 29 belongs to any one of the above cases, and set the error output to 1 in the case other than the above.

FIG. 30 specifically shows a method of producing addresses by address producing circuit 86. Referring to FIG. 30, each leading region 90 of 3 bits is used such that the flag value is stored at flag region 50 of leading 2 bits as it is, and "0" is stored at the third bit if the flag value is between 0 and 2. The run data and level data are assigned to the succeeding bits in accordance with the class as shown in FIG. 30. Thereby, all possible combinations of (run, level) can be represented with 11 bits. The address space of 11 bits corresponds to 2 kilowords. The data at each address has a width of 13 bits. Therefore, memory 64 requires only 2 kilowords×13 bits. In the prior art, the memory of 8 kilowords×22 bits is required, so that the invention can reduce the required memory to a fraction smaller than ⅙. The construction using only the art disclosed in Japanese Patent Laying-Open No. 4-142163 requires 13 bits for the address, and requires the memory space of 8 kilowords. Even in comparison with this, the variable-length coding can be performed with the memory reduced into ¼.

Figure 31:
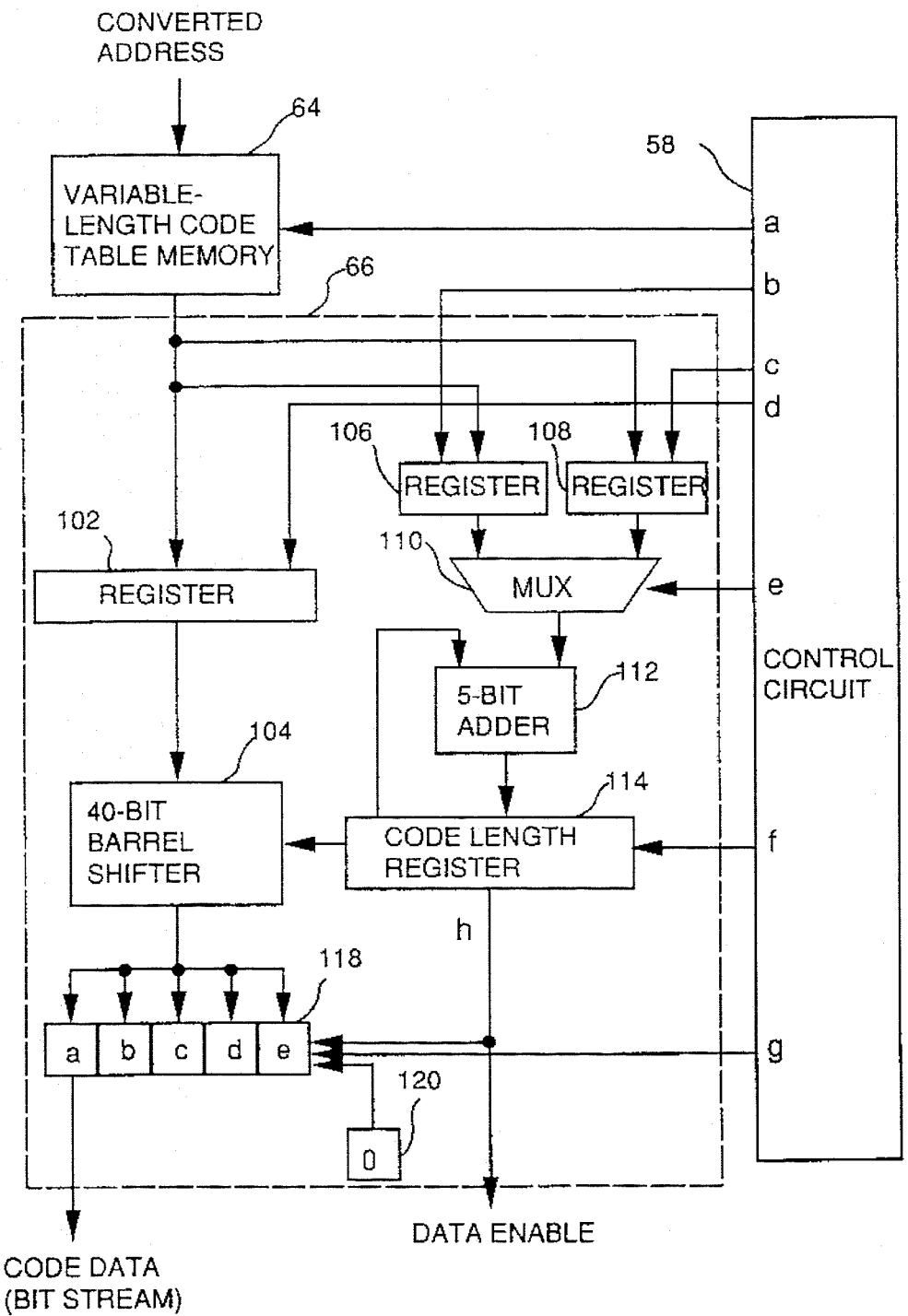
FIG. 31 is a block diagram of a variable-length code generating circuit in an embodiment of the invention.

FIG. 31 shows variable-length code generating circuit 66 together with variable-length code table memory 64 and control circuit 68.

Referring to FIG. 31, variable-length code generating circuit 66 includes registers 102, 106 and 108, a multiplexer 110, a 5-bit adder 112, a variable-length code register 114, a 40-bit barrel shifter 104, a shift register 118 formed of 8-bit registers 118a–118e, and a zero generating circuit 120. In FIG. 31, the same parts and portions as those in FIG. 11 bear the same reference numbers. Names and functions of those bearing the same reference numbers are the same.

Figure 11:
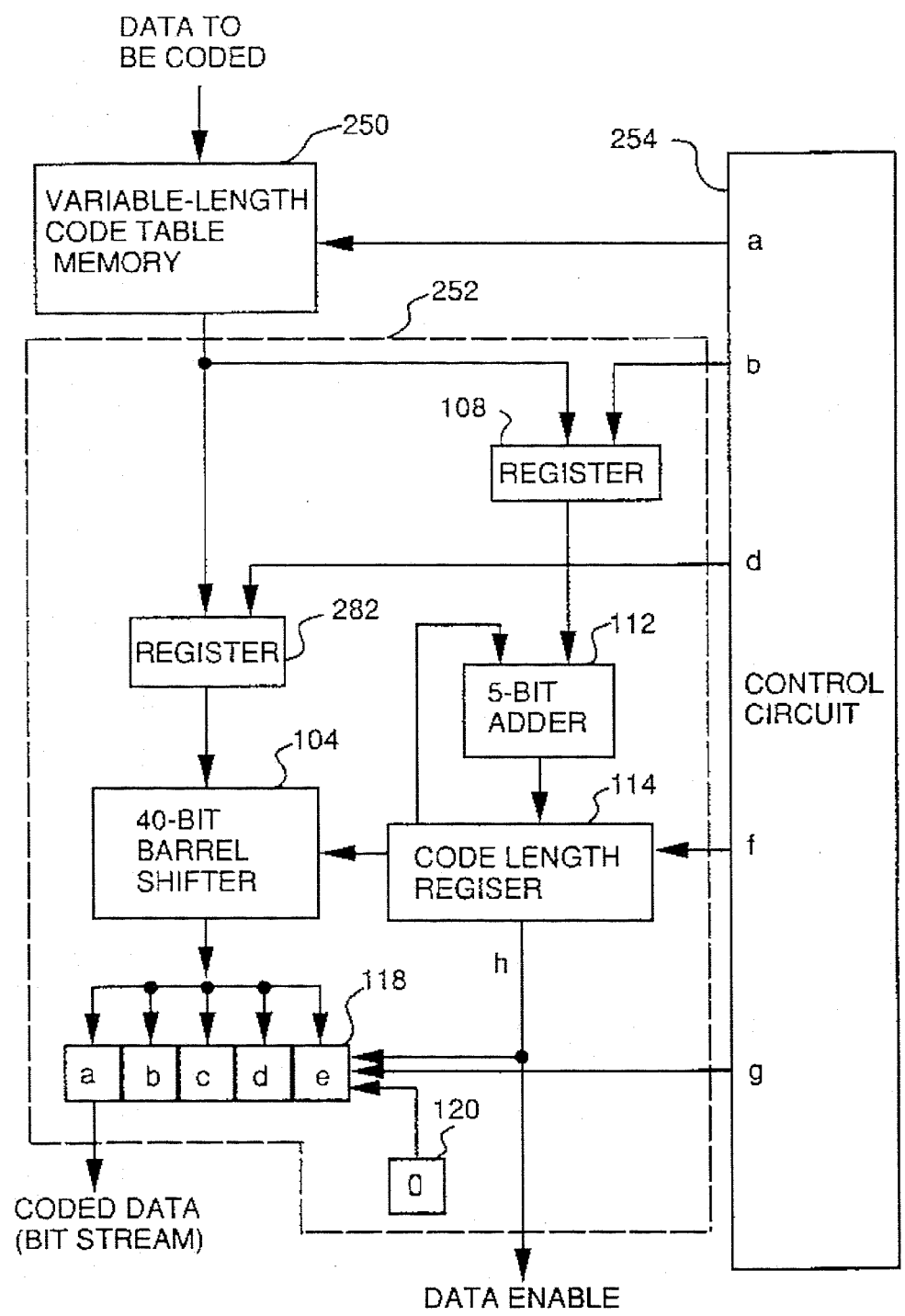
FIG. 11 is a block diagram of a conventional variable-length code generating unit.

Variable-length code generating circuit 66 shown in FIG. 31 differs the conventional circuit 252 shown in FIG. 11 in that it additionally includes register 106 and multiplexer 110. Register 102 corresponds to register 282 shown in FIG. 11, but the required bit number thereof can be reduced because the code length of code sent from variable-length code table memory 64 is shorter than that in the prior art.

Register 106 is connected to receive data indicative of the number of leading and continuing 0's in the variable-length code from variable-length code table memory 64. Outputs of registers 108 and 106 are connected to two inputs of multiplexer 110. The output of multiplexer 110 is connected to one of inputs of 5-bit adder 112. Other input of 5-bit adder 110 is connected to the output of variable-length register 114.

Control circuit 68 sends control signals a–g to operate variable-length code table memory 64 and variable-length code generating circuit 66 as follows.

Figure 32:
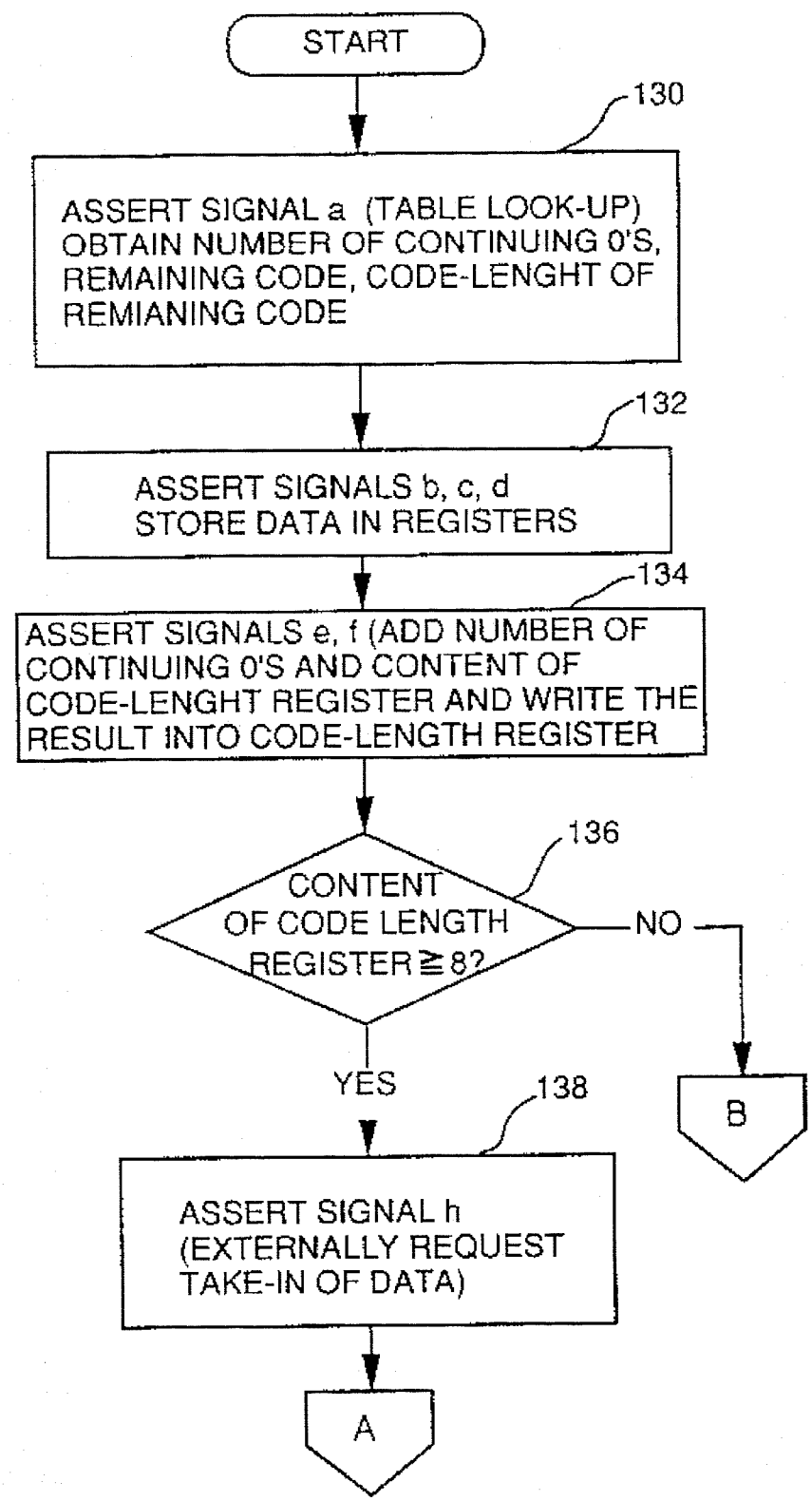
FIGS. 32 to 34 are flow diagrams showing operation of the variable-length code generating circuit in an embodiment of the invention.

Referring to FIG. 32, signal a is assert at step 130. Thereby, the number of leading and continuing 0's stored at the converted address, the remaining code and the code length of remaining code are output from variable-length code table memory 64.

At step 132, signals b, c and d are asserted, and the remaining code, the code length of remaining code and the number of leading and continuing 0's are stored at registers 102, 106 and 108, respectively.

At step 134, signals e and f are asserted. In response to assertion of signal e, multiplexer 110 selects and supplies the content of register 106 to 5-bit adder 112. Therefore, 5-bit adder 112 adds the number of leading and continuing 0's and the content of code length register 114 together, and supplies the result to code length register 114. In response to assertion of signal f, code length register 114 stores the output of 5-bit adder 112.

At step 136, it is determined whether the content of code length register 114 is smaller than 8 or not. If it is smaller than 8, the control advances to step 142. When the content of code length register 114 is 8 or more, control signal h is asserted at step 138. This control signal h is externally output as the data enable signal for externally requesting take-in-of data. Eight-bit register 118a at the leading place in shift register 118 outputs 8-bit data as a variable-length code in response to control signal h.

Figure 33:
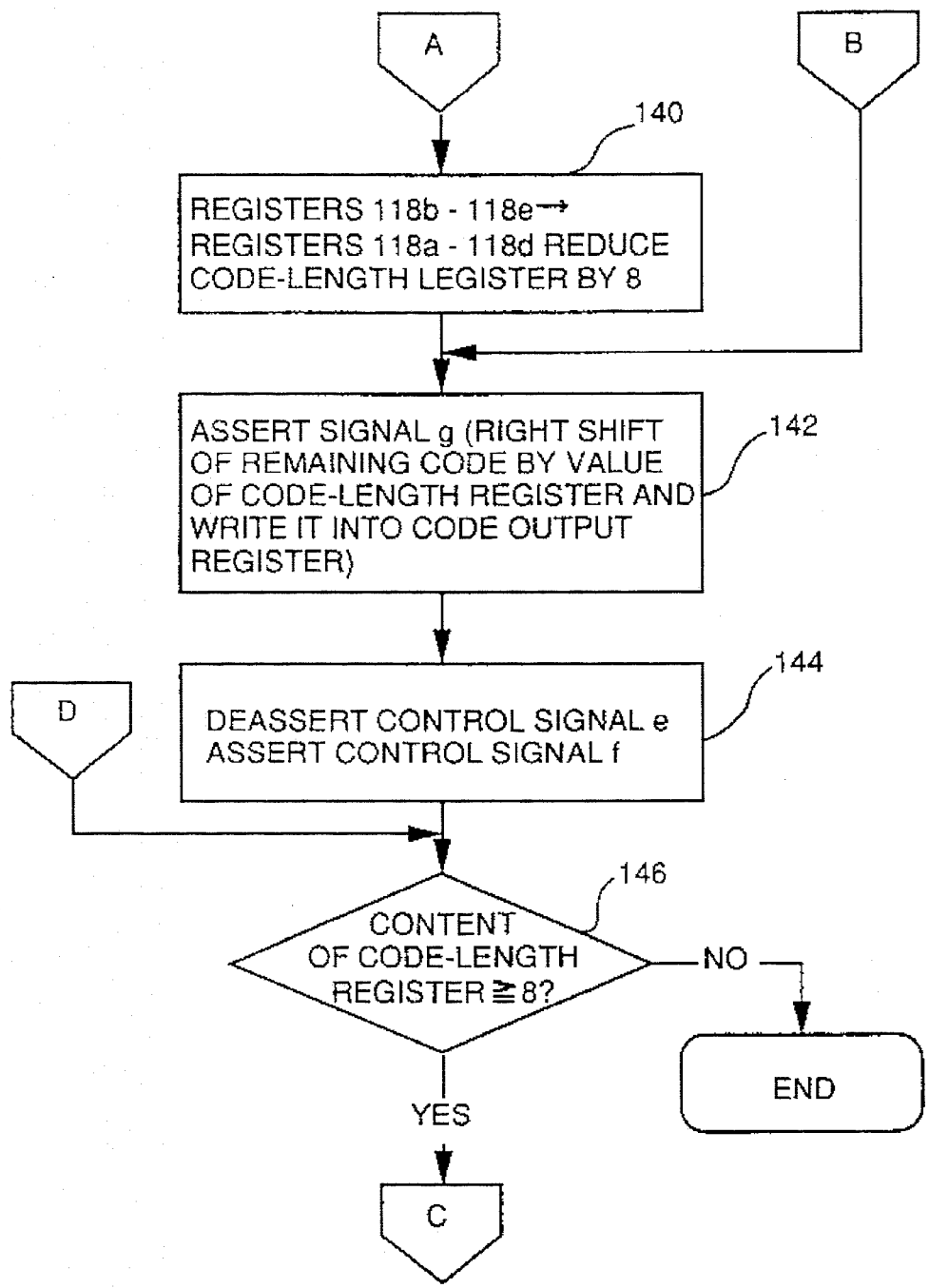

Referring to FIG. 33, contents of registers 118b–118e are shifted to registers 118a–118d at step 140. The content of code length register 114 is reduced by 8. Register 118e is filled with 0's which are shifted thereto from zero generating circuit 120.

At step 142, control signal g is asserted. Shift register 118 stores the code which remains after 40-bit barrel shifter 104 shifts it by the value of code length register 114 to the right. It should be noted that, at this time, the content from the leading place to the place of the value of code length register is stored, and thereafter the remaining code is added.

At step 144, control signal e is deasserted, and control signal f is asserted. Thereby, multiplexer 110 adds the code length of remaining code stored at register 108 to 5-bit adder 112. Five-bit adder 112 adds the value of code length register 114 and the length of remaining code together and supplies the result to code length register 114. Code length register 114 stores the output of 5-bit adder 112 in response to assertion of control signal f.

Figure 34:
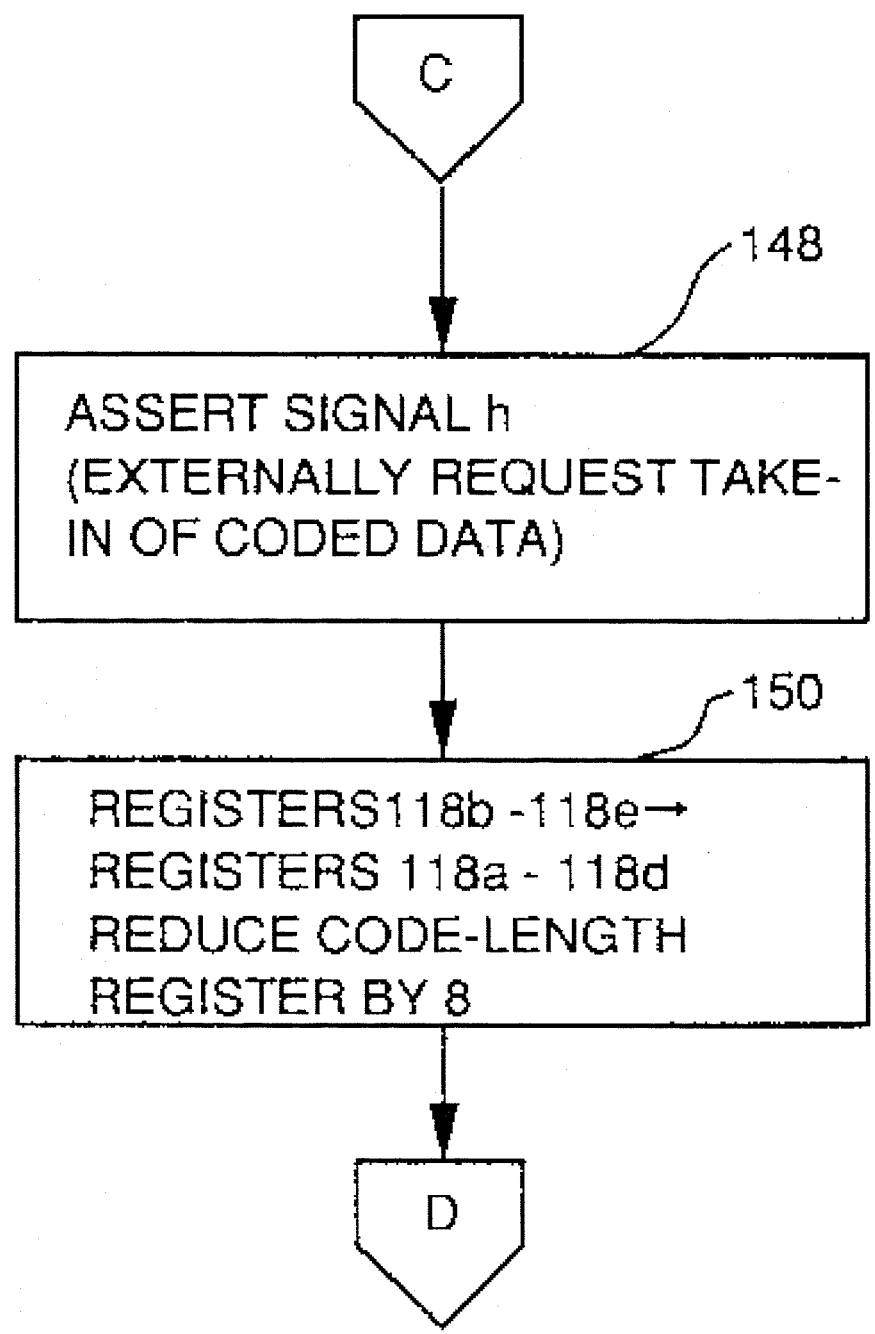

At step 146, it is determined whether the content of code length register 114 is smaller than 8 or not. If smaller than 8, the variable-length coding processing of one data is finished. If it is 8 or more, the control advances to step 148 in FIG. 34. At step 148, control signal h is asserted, and take-in of coded data is externally requested. Shift register 118 outputs the value of leading 8-bit register 118a as coded data in response to the assertion of control signal h.

Further, at step 150, contents of registers 118b–118e are shifted to registers 118a–118d, and 0's sent from zero generating circuit 120 are shifted into register 118e. The content of code length register 114 is reduced by 8, and the control returns to step 146 in FIG. 33.

The above processing is repetitively performed on respective data, whereby the variable-length coding is performed.

Operation of the circuits shown in FIG. 31 will be specifically described below. All contents of code output register 118 and code length register 114 are zero at the initial state. First, it is assumed that the coded variable-length code is "001010". The number of leading and continuing 0's is "2", the remaining code is "1010", and the code length of remaining code is "4".

The number of leading and continuing 0's, i.e., "2" is supplied to 5-bit adder 112 via register 106 and multiplexer 110. Five-bit adder 112 adds the input data "2" and the content "0" of code length register 114 together. The result, i.e., "2" is stored in code length register 114.

Remaining code "1010" is supplied to 40-bit barrel shifter 104. Since the content of code-length register 114 is "2", the variable-length code is shifted by 2 bits to the right by 40-bit barrel shifter 104, and is supplied to shift register 118 provided for outputting the code. Thus, "001010" is stored at 1st to 6th bits in shift register 118 provided for outputting the code.

The length "4" of remaining code is supplied to 5-bit adder 112 via register 108 and multiplexer 110. Five-bit adder 112 adds the content of code length register 114, i.e., "2" and the output of multiplexer 110, i.e., "4" together and supplies the result to code-length register 114. Code length register 114 stores the supplied result of "6".

Description will now be given on the operation of circuit 66 which is performed when the coded variable-length code of "00001000" is supplied. In this case, the number of leading and continuing 0's is "4", the remaining code is "1000", and the length of remaining code is "4".

The number of leading and continuing 0's, i.e., is supplied to 5-bit adder 112 via register 106 and multiplexer 110. Five-bit adder 112 adds the input data "4" and the content "6" of code length register 114 together. The result of "10" is supplied to code length register 114 and is stored therein.

Remaining code "1000" is supplied to 40-bit barrel shifter 104 via register 102. The content of code-length register 114 is "10". Therefore, the remaining code is shifted by 10 bits to the right by 40-bit barrel shifter 104, and is supplied to shift register 118 for outputting the code. Shift register 118 stores the output of 40-bit barrel shifter 104 at the eleventh and succeeding bits. In this state, shift register 118 has stored at the 1st to 6th bits the variable-length code initially supplied. The second variable-length code "00001000" is stored at 7th to 14th bits.

The length "4" of remaining code is supplied to 5-bit adder 112 via register 108 and multiplexer 110. Five-bit adder 112 adds the input data "4" and the content of code length register 114, i.e., "10" together, and supplies the result of "14" to code-length register 114 for storing the same. Therefore, control signal h is asserted, and the variable-length code is output.

FIG. 35 shows a series of data supplied to variable-length code generating circuit 66 shown in FIG. 31. FIGS. 36 to 38 show change of contents of shift register 118 in FIG. 31 caused by these data.

Referring to FIG. 35, it is assumed that variable-length codes "110", "01000", "001010", "00001100", "001001100", "001000010" and "00000010100" are sequentially supplied. In these variable-length codes, the numbers of leading and continuing 0's are 0, 1, 2, 4, 2, 2 and 6, and the remaining codes are "110", "1000", "1010", "1100", "1001100", "1000010" and "10100". The remaining code lengths are 3, 4, 4, 4, 7, 7 and 5.

FIG. 36 shows at (a) the initial state. In the initial state, all contents of registers 118a–118e and variable-length code register 114 are 0.

At (b) in FIG. 36 is shown a state that data 1 is input. "110" is stored at 1st to 3rd bits in register 118a, and 3 is stored in the code-length register.

As shown at (c) in FIG. 36, since the number of leading (and continuing) 0 in the second data is 1, "0" at 4th bit in register 118a becomes valid as the leading end of the next code, and the content of code-length register goes to 4. Subsequently, as shown at (d) in FIG. 36, data 2 is input, and the remaining code "1000" of data 2 is stored at four bits starting from fifth place in register 118a. The code-length register takes the value of 8.

Thereafter, respective data are input as shown in FIGS. 36 to 38, and variable-length codes are output as shown at (e) in FIG. 36, (c) and (f) in FIG. 37, and (b), (e) and (f) in FIG. 38. The output variable-length code thus formed is:

"11001000001010000011000010011000010000100000010".

It can be understood that the bit stream of the variable-length codes shown in FIG. 35 is output.

According to the invention, as described above, the variable-length code table can be constructed with a memory of a smaller capacity than that in the prior art, and the invention can be applied to the image compression coding standard of not only MPEG1 but also H261 and JPEG. Since intended variable-length codes can be formed by a simple structure formed of the shift register, 5-bit adder and registers, the variable-length codes can be produced fast by a simple circuit structure. Although the embodiments have been described in connection with the case where the number of leading and continuing 0's (or 0) is utilized, the invention is not restricted thereto, but may likewise be applied to the case where the number of leading and continuing 1's is utilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable-length code table used for producing a variable-length code from data formed of one set of first and second equal-length components each taking a value in a given range, wherein said variable-length code table stores at an address uniquely assigned by said one set of said equal-length components a corresponding variable-length code and a code length of said variable-length code;

combinations of said first and second equal-length components are predetermined in number and finite;

a manner of said combination is preselected such that the maximum value of the absolute value of said first equal-length component increases as the absolute value of said second equal-length component combined therewith decreases;

said second equal-length components are classified into a plurality of classes in accordance with the magnitude of the absolute value;

each of said addresses includes, a first region having a value and a length uniquely specified based on the class including said second equal-length component, a second region storing said first equal-length component, and a third region storing said second equal-length component, and is constructed to have a fixed length as a whole; and region lengths of said second and third regions each are determined correspondingly to the class including said second equal-length component to have the minimum value required for storing the maximum values of the absolute values of said first and second equal-length components of the combinations of said equal-length components included in the corresponding class.

2. The variable-length code table according to claim 1, wherein said variable-length code is formed of the number of given first characters continuing from a leading end and a remaining code, and said code length is the code length of said remaining code.

3. The variable-length code table according to claim 2, wherein said first character is one of 0 and 1.

4. The variable-length code table according to claim 3, wherein said variable-length code table is used in image compression coding standard MPEG, said first equal-length component is run data, and said second equal-length component is level data.

5. The variable-length code table according to claim 3, wherein said variable-length code table is used in image compression coding standard H261, said first equal-length component is run data, and said second equal-length component is level data.

6. The variable-length code table according to claim 2, wherein said variable-length code table is used in image compression coding standard MPEG, said first equal-length component is run data, and said second equal-length component is level data.

7. The variable-length code table according to claim 2, wherein said variable-length code table is used in image compression coding standard H261, said first equal-length component is run data, and said second equal-length component is level data.

8. A variable-length coding device for producing a variable-length code from data formed of one set of first and second equal-length components using said variable-length code table set forth in claim 2, further comprising:

address converting means for receiving one set of said equal-length components and performing conversion of an address correspondingly to said one set of said equal-length components based on said class of said second equal-length component included in said one set of said equal-length components and said one set of said equal-length components to supply the same to said variable-length code table; and character adding means being operable based on the number of said leading and continuing first characters of said variable-length code output from said variable-length code table, said remaining code of the same and the code length of said remaining code to output a variable-length code including said first characters equal in number to said number to the leading end of said remaining code.

9. The variable-length coding device according to claim 8, wherein said character adding means includes:

shift register means being responsive to a predetermined shift signal to perform shifting of data by a predetermined length in a predetermined direction, sequential shifting out of the data from a forward end with respect to said predetermined direction for outputting the variable-length code, and sequential shifting in of said first characters into an end opposite to said forward end with respect to said predetermined direction;

data length storing means for storing an effective data length stored in said shift register means and being responsive to the fact that said stored effective data length exceeds a predetermined length to supply said shift signal to said shift register means and reduce said stored effective data length by said predetermined length; and shift transferring means for shifting said remaining code by the number of said first characters from a position determined by said data length storing means and storing the same in said shift register means, wherein said data length storing means increments the stored effective data length by a sum of the number of said first characters and the code length of said remaining code in response to the fact that said remaining code is stored in said shift register means by said shift transferring means.

10. The variable-length code table according to claim 1, wherein said variable-length code table is used in image compression coding standard H261, said first equal-length component is run data, and said second equal-length component is level data.

11. The variable-length code table according to claim 1, wherein said variable-length code table is used in image compression coding standard MPEG, said first equal-length component is run data, and said second equal-length component is level data.

12. A variable-length coding device for producing a variable-length code from data formed of one set of first and second equal-length components using said variable-length code table set forth in claim 1, further comprising:

address converting means for receiving one set of said equal-length components and performing conversion of an address correspondingly to said one set of said equal-length components based on said class of said second equal-length component included in said one set of said equal-length components and said one set of said equal-length components to supply the same to said variable-length code table.

* * * * *